United States Patent
Heo et al.

(10) Patent No.: US 10,040,192 B2
(45) Date of Patent: Aug. 7, 2018

(54) SUBSTRATE TRANSFER UNIT, SUBSTRATE TREATING APPARATUS INCLUDING THE SAME, AND SUBSTRATE TREATING METHOD

(71) Applicants: Seok Heo, Hwaseong-si (KR); Sun Ho Kim, Seoul (KR); Chaemook Lim, Yongin-si (KR); JaeChul Hwang, Seoul (KR)

(72) Inventors: Seok Heo, Hwaseong-si (KR); Sun Ho Kim, Seoul (KR); Chaemook Lim, Yongin-si (KR); JaeChul Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 14/956,702

(22) Filed: Dec. 2, 2015

(65) Prior Publication Data

US 2016/0172224 A1    Jun. 16, 2016

(30) Foreign Application Priority Data

Dec. 11, 2014    (KR) .................. 10-2014-0178642

(51) Int. Cl.
*B25J 9/04*    (2006.01)
*H01L 21/677*    (2006.01)

(52) U.S. Cl.
CPC .............. *B25J 9/042* (2013.01); *B25J 9/041* (2013.01); *H01L 21/67742* (2013.01)

(58) Field of Classification Search
CPC ..... B25J 9/04; B25J 9/041; B25J 9/042; B25J 9/043; B25J 9/044; B25J 9/046; B25J 9/047; B25J 9/106; B25J 9/1615; B25J 9/162; Y10S 901/27; Y10S 901/28; Y10S 901/29; Y10T 74/20329; Y10T 74/20335
USPC ................. 74/490.05; 414/744.5; 901/28, 29
See application file for complete search history.

(56) References Cited

U.S. PATENT DOCUMENTS

| | | | |
|---|---|---|---|
| 6,108,589 | A | 8/2000 | Sasahara et al. |
| 8,398,355 | B2 | 3/2013 | Holtkamp et al. |
| 8,509,949 | B2 | 8/2013 | Bordyn et al. |
| 2012/0141235 | A1 | 6/2012 | Krupyshev et al. |

(Continued)

FOREIGN PATENT DOCUMENTS

| | | |
|---|---|---|
| JP | 3519884 B2 | 4/2004 |
| JP | 2006093710 A | 4/2006 |

(Continued)

*Primary Examiner* — Anna M Momper
*Assistant Examiner* — Brendan P Tighe
(74) *Attorney, Agent, or Firm* — Harness, Dickey & Pierce, P.L.C.

(57) ABSTRACT

A substrate transfer unit includes a rotation body, an arm member, and first and second blades. The arm member is on the rotation body, and the first and second blades are on the arm member. The arm member includes a first arm including a lower link on the rotation body and an upper link connected on one side of the lower link and a second arm including a first portion and a second portion. The first portion has a first pivot on the other side of the upper link and is connected with the first blade at a first height from the first pivot. The second portion is connected with the first portion and with the second blade at a second height, higher than the first height, from the first pivot.

9 Claims, 44 Drawing Sheets

(56) References Cited

U.S. PATENT DOCUMENTS

2013/0039726 A1\* 2/2013 Brodine ............ H01L 21/67742
　　　　　　　　　　　　　　　　　　　　414/226.05
2014/0026705 A1　1/2014　Sasaki et al.
2014/0031982 A1　1/2014　Yamada

FOREIGN PATENT DOCUMENTS

| JP | 2013121617 A | 6/2013 |
| --- | --- | --- |
| JP | 5282874 B2 | 9/2013 |
| JP | 2014024162 A | 2/2014 |
| JP | 5476507 B2 | 4/2014 |
| KR | 101050815 B1 | 7/2011 |

\* cited by examiner

SUBSTRATE TRANSFER UNIT, SUBSTRATE TREATING APPARATUS INCLUDING THE SAME, AND SUBSTRATE TREATING METHOD

CROSS-REFERENCE TO RELATED APPLICATIONS

A claim for priority under 35 U.S.C. § 119 is made to Korean Patent Application No. 10-2014-0178642 filed Dec. 11, 2014, in the Korean Intellectual Property Office, the entire contents of which are hereby incorporated by reference.

BACKGROUND

Example embodiments of the inventive concepts described herein relate to treating method and apparatus, and more particularly, relate to a substrate transfer unit, a substrate treating apparatus including the same, and a substrate treating method.

An equipment of cluster type is mainly used as equipment for manufacturing a display device and a semiconductor device. The equipment of cluster type may include a transfer chamber, process chambers, and load lock chambers. The process chambers and the load lock chambers are around the transfer chamber. A transfer unit is in the transfer chamber. The transfer unit transfers a substrate to the process chambers and the load lock chambers. The transfer unit may include a Selective Compliant Assembly Robot Arm (SCARA) robot. For example, the SCARA robot may include an arm(s) and a blade(s). The transfer unit is designed such that it does not collide with an inner wall of the transfer chamber. In general, the transfer chamber may have an inner area of which the operating radius is greater than lengths of the arm(s) and the blade(s).

SUMMARY

Example embodiments of the inventive concepts provide a substrate transfer unit capable of minimizing and/or reducing a rotation area.

Example embodiments of the inventive concepts also provide a transfer unit, a substrate treating apparatus including the same, and a substrate treating method capable of removing movement interference in a transfer chamber.

In one example embodiment of the inventive concepts, a substrate transfer unit is provided which includes a rotation body, an arm member, and first and second blades. The arm member is on the rotation body, and the first and second blades are on the arm member. The arm member includes a first arm including a lower link on the rotation body and an upper link connected on one side of the lower link and a second arm including a first portion and a second portion. The first portion has a first pivot on the other side of the upper link and is connected with the first blade at a first height from the first pivot. The second portion is connected with the first portion and with the second blade at a second height, higher than the first height, from the first pivot.

In another example embodiment of the inventive concepts, a substrate treating apparatus includes a transfer chamber, at least one first chamber connected with the transfer chamber in a first direction, at least one second chamber connected with the transfer chamber in a second direction crossing the first direction, and a transfer unit in the transfer chamber and configured to transport a substrate between the first chamber and the second chamber. The transfer unit includes first and second blades configured to transport the substrate to the first chamber and the second chamber; and an arm member in the transfer chamber and connected with the first and second blades. The arm member includes a first arm including a lower link in the rotation body and an upper link connected on one side of the lower link; and a second arm including a first portion and a second portion. The first portion has a first pivot on the other side of the upper link and is connected with the first blade at a first height from the first pivot and the second portion is connected with the first portion and with the second blade at a second height, higher than the first height, from the first pivot.

In at least one example embodiment of the inventive concepts, a substrate treating method includes loading a substrate from a buffer chamber, connected with a transfer chamber in a first direction, to a process chamber, connected in a second direction crossing the first direction, through the transfer chamber, by a transfer unit having an arm member and a plurality of blades and in the transfer chamber; performing a manufacturing process about the substrate in the buffer chamber; and unloading the substrate from the process chamber to the buffer chamber. Each of the loading and the unloading includes aligning the blades in a parallel direction.

In another example embodiment of the inventive concepts, a substrate transfer unit includes a rotation body, an arm member on the rotation body, and first and second blades on the arm member. The arm member includes a first link on the rotation body, a second link connected on one side of the first link, and a third link having a pivot on the other side of the second link and configured to connect the first and second blades to both edges of the pivot.

In some example embodiments of the inventive concepts, a substrate transfer unit includes a rotation body, a first rotating arm attached to the rotation body, the first rotating arm including a link, a second rotating arm attached to the first rotating arm, the second rotating arm including an upper portion and a lower portion, and a blade rotatably attached to one of the upper portion or the lower portion of the second rotating arm.

BRIEF DESCRIPTION OF THE FIGURES

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION

Figure 1:
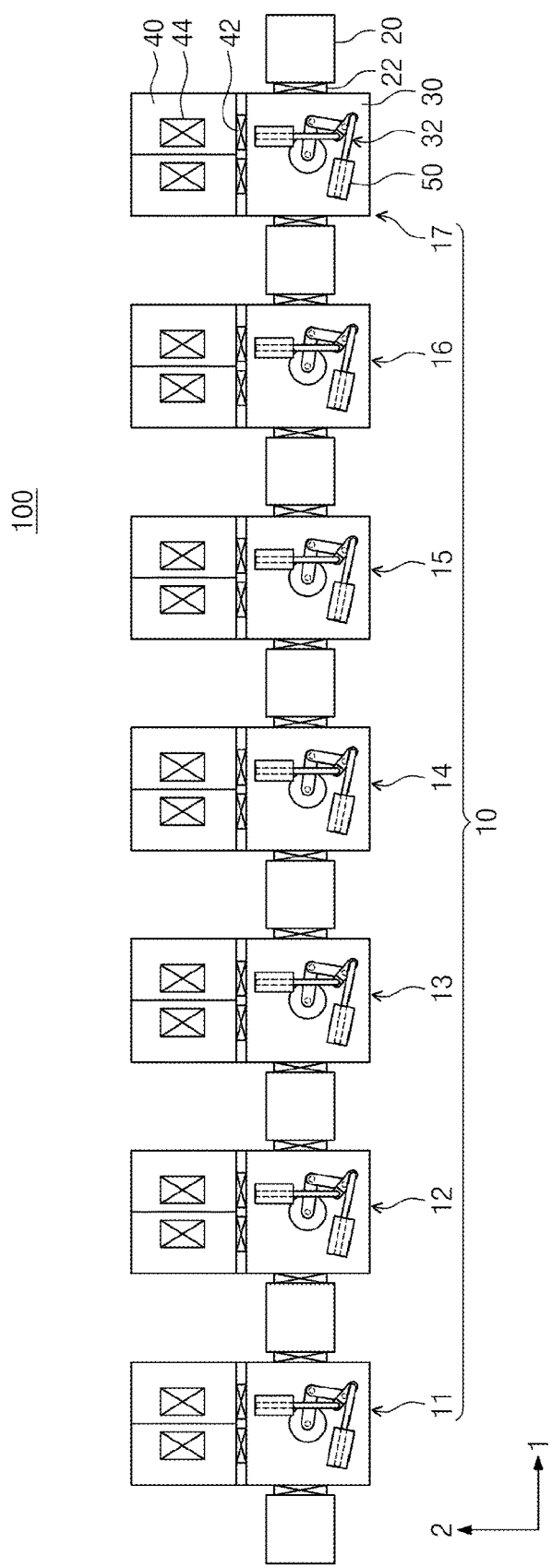
FIG. 1 is a diagram schematically illustrating substrate treating apparatus according to an example embodiment of the inventive concepts.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a diagram schematically illustrating substrate treating apparatus 100 according to an example embodiment of the inventive concepts.

A substrate treating apparatus 100 may be an apparatus for manufacturing a display device or a semiconductor device. The substrate treating apparatus 100 may include a plurality of unit systems (or unit equipment) 10. The plurality of unit systems 10 may take charge of conveyance and unit manufacturing processes. For example, the substrate treating apparatus 100 may include a first unit system 11 to a seventh unit system 17. The number of unit systems 10 may not be limited to this disclosure. The number of unit systems 10 may be decided according to a process where a device is formed on a substrate 50. The unit systems 10 may be connected in a first direction 1. In an example embodiment, each of the unit systems 10 may include buffer chambers 20, a transfer chamber 30, and a pair of process chambers 40.

The buffer chambers 20 are connected with the transfer chamber 30. The buffer chambers 20 and the transfer chamber 30 may be vacuum chambers for providing the substrate 50 to the process chambers 40. The buffer chambers 20 may be pass chambers or load lock chambers. The buffer chambers 20 are at both sides of the transfer chamber 30 in the first direction 1. The buffer chambers 20 and the transfer chamber 30 may be positioned in turn in the first direction 1. A first gate 22 is between the buffer chamber 20 and the transfer chamber 30. The first gate 22 is closed and opened between the buffer chamber 20 and the transfer chamber 30.

The transfer chamber 30 is connected with the process chambers 40. The process chambers 40 are connected with the transfer chamber 30 in a direction different from the buffer chamber 20. For example, the process chambers 40 may be positioned in a second direction 2 at the transfer chamber 30. The second direction 2 and the first direction 1 may intersect. A second gate 42 is between the process chambers 40 and the transfer chamber 30. The second gate 42 is closed and opened between the process chambers 40 and the transfer chamber 30.

The transfer unit 32 is in the transfer chamber 30. The transfer unit 32 transfers the substrate 50 between the buffer chamber 20 and the process chambers 40. When the transfer unit 32 moves into the buffer chamber 20 and the process chambers 40, the first gate 22 and the second gate 42 are closed and opened oppositely. If the transfer unit 32 loads the substrate 50 in the buffer chamber 20, the first gate 22 is opened, and the second gate 42 is closed. If the transfer unit 32 unloads the substrate 50 from the process chambers 40, the first gate 22 is closed, and the second gate 42 is opened. The first and second gates 22 and 42 all are closed when the substrate 50 is transferred in the transfer chamber 30.

The process chambers 40 perform a unit manufacturing process about the substrate 50. The unit manufacturing process may include a thin film deposition process. The process chambers 40 connected with one transfer chamber 30 may perform the same unit manufacturing process. Each of the process chambers 40 has a stage 44. The substrate 50 is safely put on the stage 44. The substrate treating apparatus 100 continuously performs the thin film deposition process.

Figure 2:
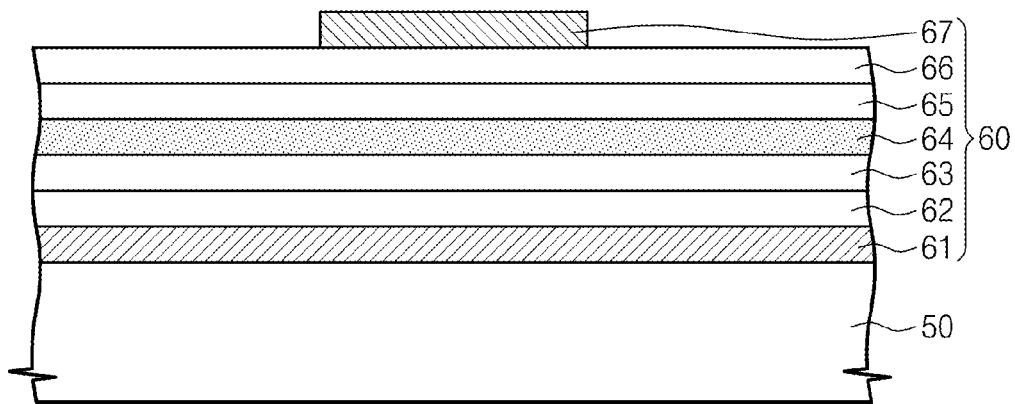
FIG. 2 illustrates an organic light-emitting device manufactured by a substrate treating apparatus of FIG. 1, according to an example embodiment of the inventive concepts.

FIG. 2 illustrates an organic light-emitting device 60 manufactured by a substrate treating apparatus 100 of FIG. 1, according to an example embodiment of the inventive concepts.

Referring to FIGS. 1 and 2, an organic light-emitting device 60 is formed on a substrate using first to seventh unit systems 11 to 17. In an example embodiment, the substrate 50 may include a large glass or plastic substrate. The substrate 50 may have a generally rectangular shape that has a horizontal length of about 1500 mm and a vertical length of about 900 mm. The organic light-emitting device 60 may include a bottom electrode 61, a first charge injection layer 62, a first charge transfer layer 63, an organic emission layer 64, a second charge transfer layer 65, a second charge injection layer 66, and a top electrode 67. The bottom electrode 61, the first charge injection layer 62, the first charge transfer layer 63, the organic emission layer 64, the second charge transfer layer 65, the second charge injection layer 66, and the top electrode 67 are sequentially formed on the substrate 50.

The bottom electrode 61 is formed using the first unit system 11. A process chamber 40 of the first unit system 11 may have a sputter (not shown) or a chemical vapor deposition apparatus. The bottom electrode 61 may be a negative electrode. The bottom electrode 61 may include indium tin oxide (ITO), aluminum, and/or graphene. Although not shown, the bottom electrode 61 may be connected with a thin film transistor on the substrate 50. The bottom electrode 61 may be patterned through a photolithography process and an etching process after being formed at other unit systems.

The first charge injection layer 62 is formed using the second unit system 12. A process chamber 40 of the second unit system 12 may have a sputter (not shown) or a chemical vapor deposition apparatus. The first charge injection layer 62 may be an electron injection layer. The first charge injection layer 62 may include a metal oxide layer or metal carbide layer including metal such as lithium, zinc, calcium, potassium, and/or cesium.

The first charge transfer layer 63 is formed using the third unit system 13. A process chamber 40 of the third unit system 13 may have a sputter (not shown) or an evaporation apparatus. The first charge transfer layer 63 may be an electron transfer layer. The first charge transfer layer 63 may include $Alq_3$, TAZ, or LiF.

The organic emission layer 64 is formed using the fourth system 14. A process chamber 40 of the fourth system 14 may have an evaporation apparatus. The organic emission layer 64 may include a unimolecular polymer. The organic emission layer 64 emits light using recombination of electrons and holes provided at the bottom and top electrodes 61 and 67. Light may vary with a composition ratio of host and dopant in organic material of the organic emission layer 64.

The second charge transfer layer 65 is formed using the fifth unit system 15. A process chamber 40 of the fifth system 15 may have an evaporation apparatus. The second charge transfer layer 65 may include αNPD, TPD, or Teflon-AF.

The second charge injection layer 66 is formed using the sixth unit system 16. A process chamber 40 of the sixth system 16 may have an evaporation apparatus. The second charge injection layer 66 may include CuPc or m-MTDATA.

The top electrode 67 is formed using the seventh unit system 17. A process chamber 40 of the seventh unit system 17 may have a sputter (not shown) or a chemical vapor deposition apparatus. The top electrode 67 may be a positive electrode. The top electrode 67 may include one or more graphene layers.

The number and sorts of the above-described unit systems 10 may be appropriately selected according to a sort of device formed on the substrate 50.

Figure 3:
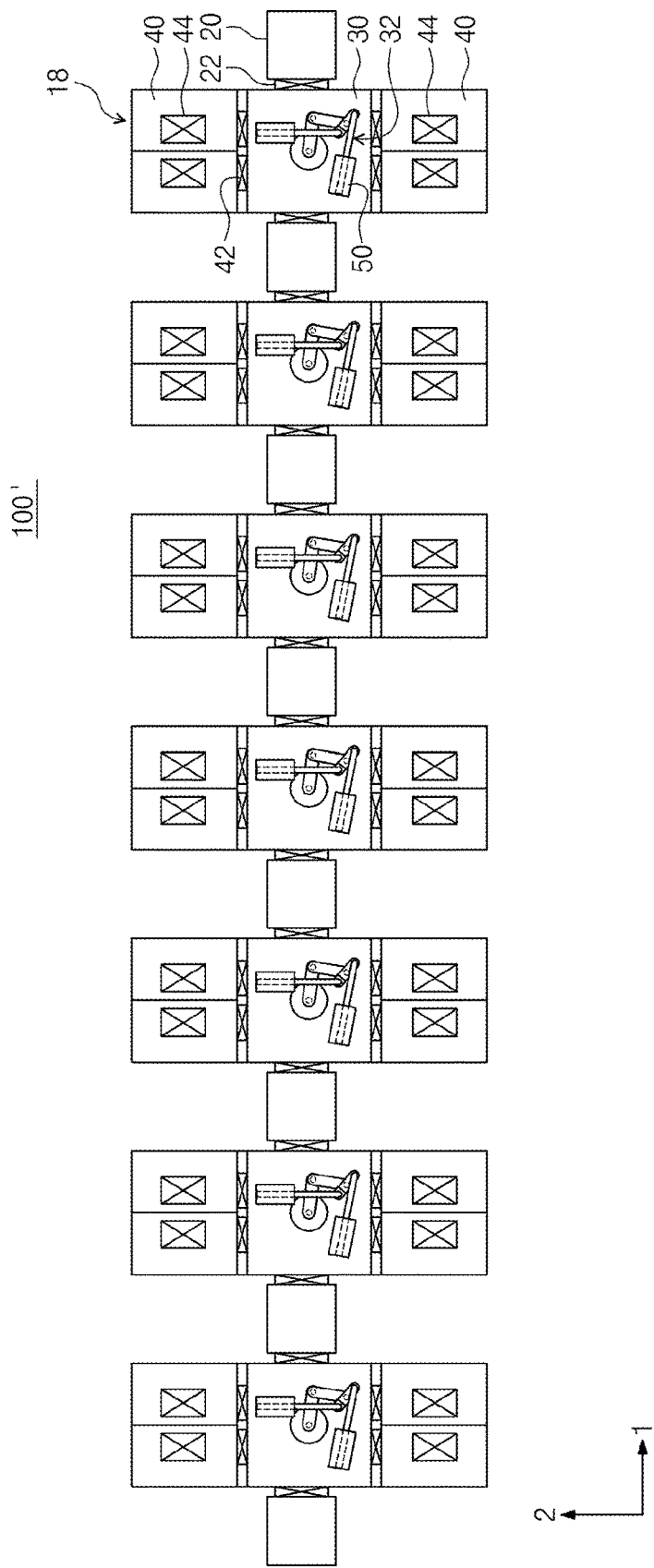
FIG. 3 is a diagram schematically illustrating a substrate treating apparatus according to another example embodiment of the inventive concepts.

FIG. 3 is a diagram schematically illustrating a substrate treating apparatus 100' according to example embodiments of the inventive concepts.

Referring to FIG. 3, process chambers 40 of a substrate treating apparatus 100' are at both sides of a transfer chamber 30 to be opposite to each other. The process chambers 40 are opposite to each other in a second direction. Buffer chambers 20 are at both sides of the transfer chamber 30 in a first direction 1. For example, each of unit systems 18 may have four process chambers 40. Four process chambers 40 and two buffer chambers 20 surround the transfer chamber 30. The buffer chambers 20, first gates 22, the transfer chamber 30, a transfer unit 32, second gates 42, and a stage 44 may be substantially the same as those of FIG. 1.

Figure 4:
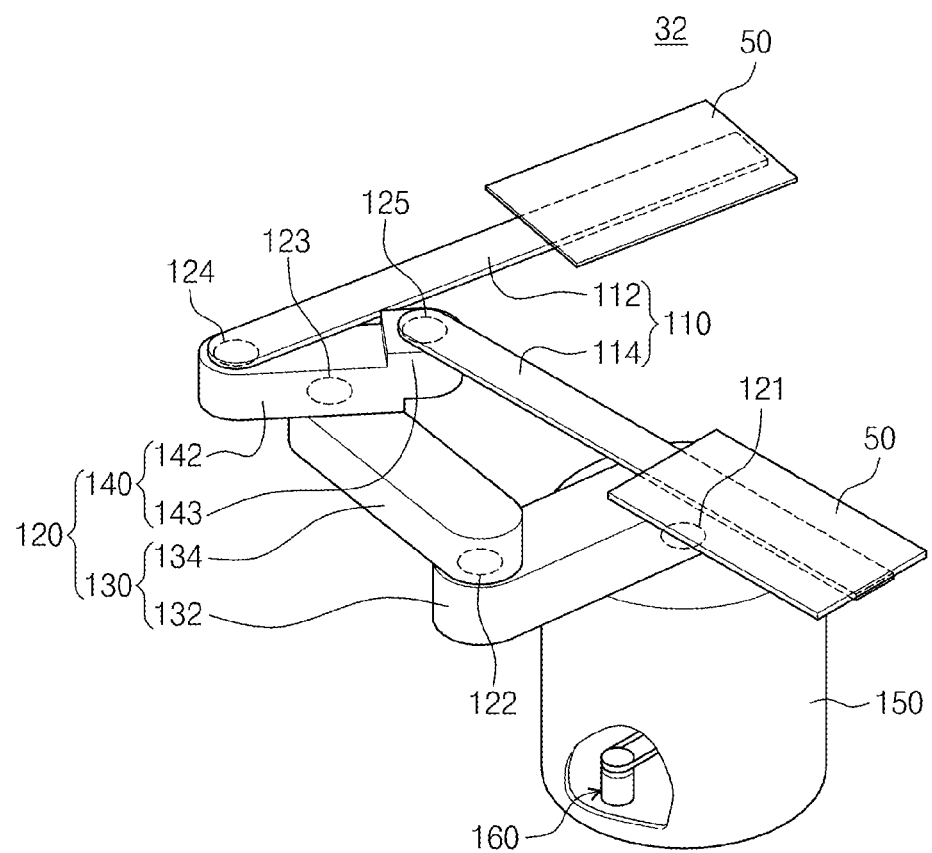
FIG. 4 illustrates a transfer unit of FIG. 1, according to an example embodiment of the inventive concepts.

FIG. 4 illustrates a transfer unit 32 of FIG. 1, according to some example embodiments of the inventive concepts.

A transfer unit 32 may include blades 110, an arm member 120, a rotation body 150, and a driving member 160.

The blades 110 support substrates 50. The substrates 50 are on the blades 110, respectively. The blades 110 are connected with the arm member 120. The blades 110 are provided to be rotatable on the arm member 120. The blades 110 move the substrates 50. The blades 110 may have the same length.

The arm member 120 is connected with the blades 110. The arm member 120 may move the blades 110 and the substrates 50. In example embodiments, the arm member 120 may include a first arm 130 and a second arm 140. The first arm 130 is on the rotation body 150. The first arm 130 may be a stretchable arm. The first arm 130 may include a lower link 132 and an upper link 134. One side of the lower link 132 is connected with the rotation body 150, and the other side thereof is connected with the upper link 134. The lower link 132 is on the rotation body 150. The lower link 132 has a first pivot 121 connected with the rotation body 150. The lower link 132 rotates on the rotation body 150. The upper link 134 is on the lower link 132. One side of the upper link 134 is connected with the lower link 132, and the other side thereof is connected with the second arm 140. The upper link 134 has a second pivot 122. The upper link 134 rotates on the lower link 132.

The second arm 140 is on the upper link 134. The second arm 140 connects the blades 110. Both edges of the second arm 140 are connected with the blades 110, respectively. The second arm 140 may include a balance beam. The center of the second arm 140 is connected with the upper link 134. In some example embodiments, the second arm 140 may include a first balance end 142 and a second balance end 143. The first balance end 142 is higher than the upper link 134. The first balance end 142 is connected with the first blade 112, and the second balance end 143 is connected with the first balance end 142. The second balance end 143 is higher than the first balance end 142. The second balance end 143 is connected with the second blade 144. The first balance end 142 has a balance pivot 123. The second arm 140 rotates on the upper link 134.

The blades 110 may include the first blade 112 and the second blade 114. The first blade 112 is on the first balance end 142. The first blade 112 has a first blade pivot 124. The first blade 112 rotates on the first balance end 142. The second blade 114 is on the second balance end 143. The second blade 114 has a second blade pivot 125. The second blade 114 rotates on the second balance end 143.

Figure 5:
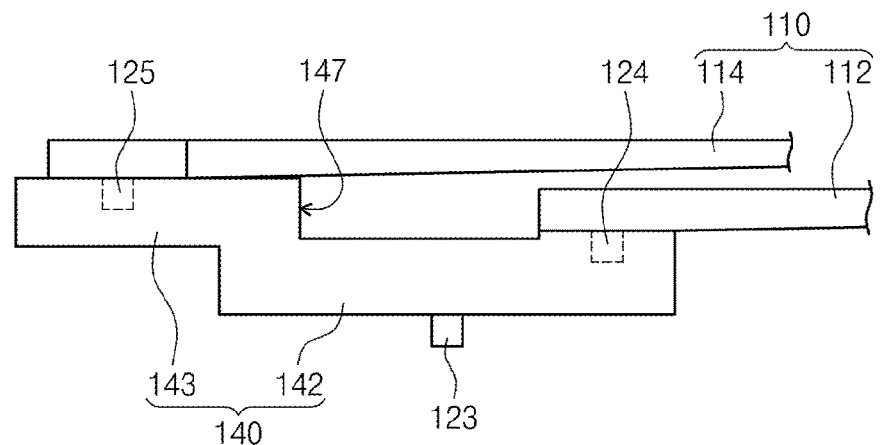
FIG. 5 illustrates a second arm and blades 110 of FIG. 4.

FIG. 5 illustrates a second arm 140 and blades 110 of FIG. 4.

A second arm 140 has at least one step difference 147. The step difference 147 of the second arm 140 may allow blades 110 to be at different heights. The first blade 112 is on one side of the second arm 140. A first blade pivot 124 is in a first balance end 142. The second blade 114 is on the other side of the second arm 140. A position where the second blade 114 is higher than a position of the first blade 112. A second blade pivot 125 is in the second balance end 143. The second blade 114 may rotate 360 degrees. Magnitude of the step difference 147 of the second arm 140 is greater than a thickness of the first blade 112. That is, the first blade 112 has a thickness smaller than the magnitude of the step difference 147. The first blade 112 rotates on the second arm 140 by a driving force of a driving member 160. The first blade 112 rotates without collision with the second blade 114.

Returning to FIG. 4, the second arm 140 adjusts a distance between the blades 110 and the first arm 130 as the first arm 130 rotates. If the first blade 112 becomes far from the upper link 134, then the second blade 114 becomes close to the upper link 134. In contrast, if the first blade 112 becomes close to the upper link 134, then the second blade 114 becomes far from the upper link 134. Similarly, the second arm 140 adjusts a distance between the blades 110. As the second arm 140 rotates, the blades 110 becomes close to or far from each other. As the second arm 140 rotates, the first blade 112 and the second blade 114 may be in an intersecting direction. For example, the blades 110 may form a generally "T" shape. In contrast, the first blade 112 and the second blade 114 may be in parallel with each other as the second arm 140 rotates.

Figure 6:
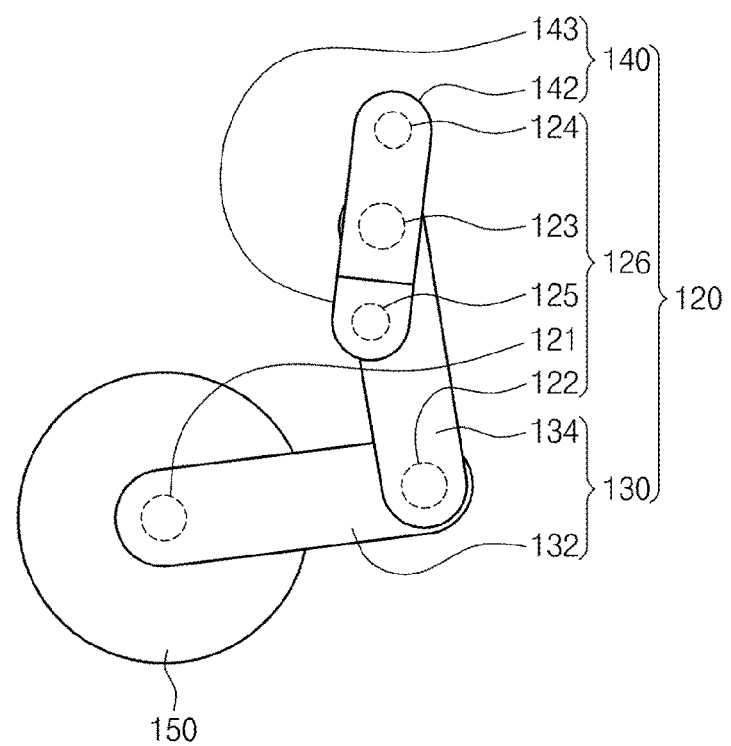
FIG. 6 illustrates an arm member of FIG. 4.

FIG. 6 illustrates an arm member 120 of FIG. 4.

Referring to FIGS. 4 and 6, a lower link 132 rotates with a first pivot 121 as the center. An upper link 134 rotates with a second pivot 122 as the center. A second arm 140 rotates with a balance pivot 123 as the center. The balance pivot 123 may correspond to a branch point of the second arm 140 and the blades 110. The balance pivot 123 is between first and second blade pivots 124 and 125. The first blade 112 rotates with the first blade pivot 124 as the center. A rotation angle of the first blade 112 may be smaller than about 360 degrees. Rotation of the first blade 112 is blocked by a step 143 of the second arm 140. The second blade 114 rotates with the second blade pivot 125 as the center. The pivots 126 may correspond to a rotational degree of freedom. For example, an arm member 120 and the blades 110 may have the rotational degree of freedom. The arm member 120 and the blades 110 may have five rotational degrees of freedom. Accordingly, a transfer unit 32 transfers a plurality of substrates 50 according to the five rotational degrees of freedom, without movement interference.

Returning to FIG. 4, a rotation body 150 supports the arm member 120. The arm member 120 rotates with the rotation body 150 as the center. The rotation body 150 has a cylindrical shape. Insides of the rotation body 150 and the arm member 120 may remain at an air pressure.

The driving member 160 provides a driving force to the arm member 120 and the blades 110. The driving member 160 is in the rotation body 150 and the arm member 120.

Figure 7:
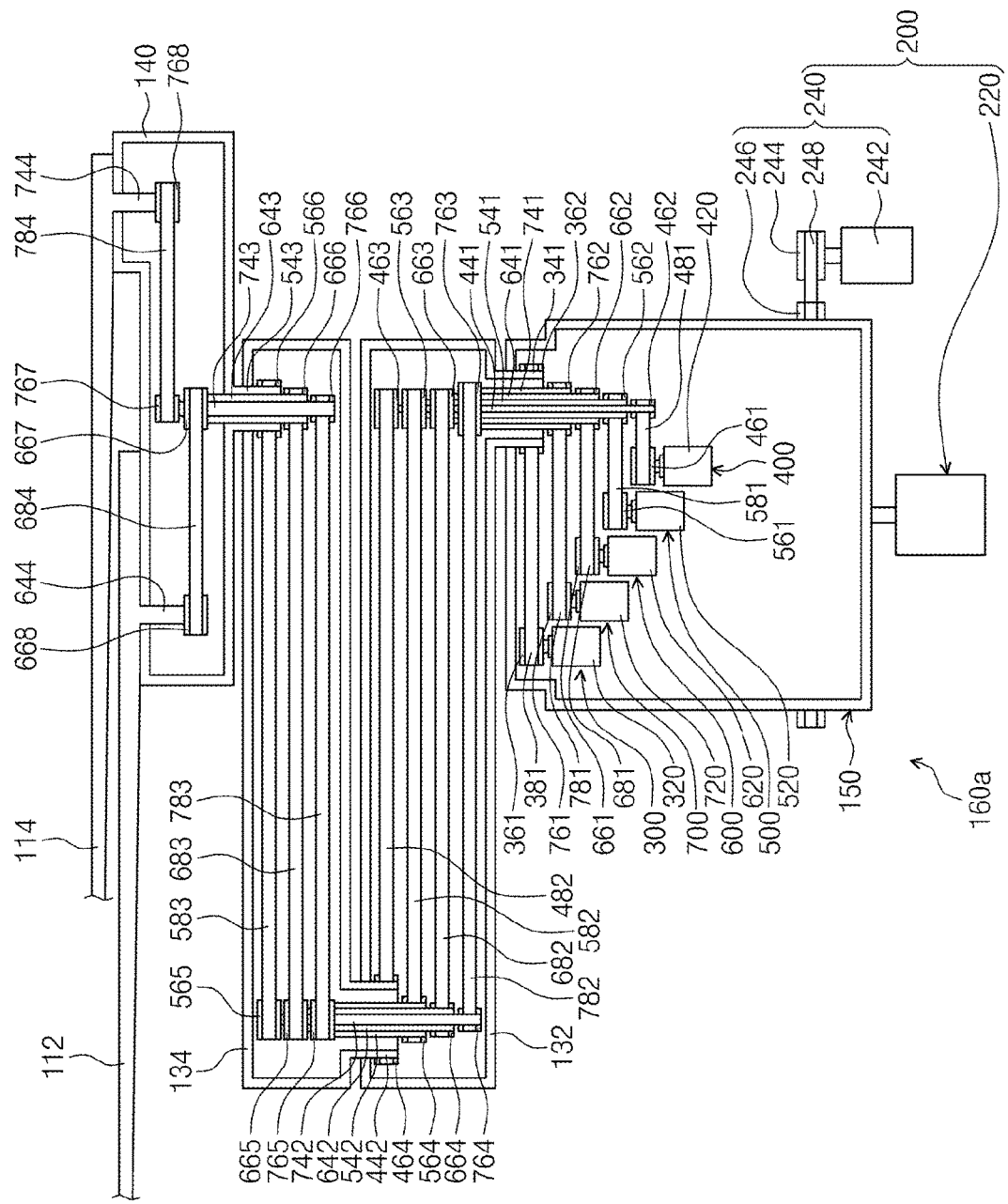
FIG. 7 illustrates a driving member of FIG. 4, according to an example embodiment of the inventive concepts.

FIG. 7 illustrates a driving member 160a of FIG. 4, according to some example embodiments of the inventive concepts.

Referring to FIG. 7, a driving member 160a may include a rotation body driver 200, a lower link driver 300, an upper link driver 400, a balance link driver 500, a first blade driver 600, and a second blade driver 700.

The rotation body driver 200 may include a vertical movement unit 220 for rectilinearly moving a rotation body upwards and downwards and a rotation driver 240 for rotating the rotation body 150. The rotation driver 240 includes a first pulley 244, a second pulley 246, and a first belt 248. The first pulley 244 is connected with a motor 242, and the second pulley 246 is mounted on the rotation body 150. The first pulley 244 and the second pulley 246 are connected by the first belt 248. A rotatory power of a motor 242 is transferred to the rotation body 150 through the first pulley 244, the first belt 248, and the second pulley 246. The vertical driver 220 may be implemented to have an assembly structure including a cylinder.

The lower line driver 300 may include a motor 320, a pivot 341, first and second pulleys 361 and 362, and a belt 381. The motor 320, the belt 381, and the first and second pulleys 361 and 362 are placed in a space of the rotation body 150. The pivot 341 is extended downwards from a lower wall of the other end of the lower link 132 and is inserted in an inner space of the rotation body 150 through an opening formed at an upper wall of the rotation body 150. The first pulley 361 is connected with the motor 320. The second pulley 362 is provided at a lower portion of the rotation body 150, and the belt 381 connects the first pulley 361 and the second pulley 362. A rotatory power of the motor 320 is transferred to the lower link 132 through the first pulley 361, the belt 381, the second pulley 362, and the pivot 341.

The upper line driver 400 may include a motor 420, a first pivot 441, a second pivot 442, first to fourth pulleys 461 to 464, and first and second belts 481 and 482. The first pivot 441 is extended from an inner space of the lower link 132 to an inner space of the rotation body 150 through the inside of the first pivot 441. The second pivot 442 is extended downwards from a lower wall of the other end of the upper link 134 and is inserted in an inner space of the lower link 132 through an opening formed at an upper wall of the lower link 132. The first pulley 461 is connected with the motor 420, and the second pulley 462 is provided at a lower portion of the first pivot 441. The first pulley 461 and the second pulley 462 are connected by the first belt 481. The third pulley 463 is provided at an upper portion of the first pivot 441, and the fourth pulley 464 is provided at a lower portion of the second pivot 442. The third pulley 463 and the fourth pulley 464 are connected by the second belt 482. A rotatory power of the motor 420 is transferred to the upper link 134 through the first pulley 461, the first belt 481, the second pulley 462, the first pivot 441, the third pulley 463, the fourth pulley 464, the second belt 482, and the second pivot 442.

The balance link driver 500 may include a motor 520, first to third pivots 541 to 543, first to sixth pulleys 561 to 566, and first to third belts 581 to 583. The first pivot 541 is extended from an inner space of the lower link 132 to an inner space of the rotation body 150 through the inside of the first pivot 541 of the lower link driver 300 and the inside of the first pivot 441 of the upper link driver 400. The second pivot 542 is extended from an inner space of the upper link 134 to an inner space of the lower link 132 through the inside of the second pivot 442 of the upper link driver 400. The third pivot 543 is extended downwards from a lower wall of a second arm 140 and is inserted in an inner space of the upper link 134 through an opening formed at an upper wall of one end of the upper link 134. The first pulley 561 is connected with the motor 520, and the second pulley 562 is provided at a lower portion of the first pivot 541. The first pulley 561 and the second pulley 562 are connected by the first belt 581. The third pulley 563 is provided at an upper portion of the first pivot 541, and the fourth pulley 564 is provided at a lower portion of the second pivot 542. The third pulley 563 and the fourth pulley 564 are connected by the second belt 582. The fifth pulley 565 is provided at an upper portion of the second pivot 542, and the sixth pulley 566 is provided at a lower portion of the third pivot 543. The fifth pulley 565 and the sixth pulley 566 are connected by the third belt 583. A rotatory power of the motor 520 is transferred to the second arm 140 through the first pulley 561, the first belt 581, the fourth pulley 564, the second pivot 542, the fifth pulley 565, the third belt 583, the sixth pulley 566, and the third pivot 543.

The first blade driver 600 may include a motor 620, first to fourth pivots 641 to 544, first to eighth pulleys 661 to 668, and first to fourth belts 681 to 684. The first pivot 641 is extended from an inner space of the lower link 132 to an inner space of the rotation body 150 through the inside of the first pivot 541 of the balance link driver 500. The second pivot 642 is extended from an inner space of the upper link 134 to an inner space of the lower link 132 through the inside of the second pivot 542 of the balance link driver 500. The third pivot 643 is extended from an inner space of the second arm 140 to an inner space of the upper link 134 through the inside of the third pivot 543 of the balance link driver 500. The fourth pivot 644 is extended downwards from a lower wall of a connection portion of the first blade 112 and is inserted in an inner space of the second arm 140. The first pulley 661 is connected with the motor 620, and the second pulley 662 is provided at a lower portion of the first pivot 641. The first pulley 661 and the second pulley 662 are connected by the first belt 681. The third pulley 663 is provided at an upper portion of the first pivot 641, and the fourth pulley 664 is provided at a lower portion of the second pivot 642. The third pulley 663 and the fourth pulley 664 are connected by the second belt 682. The fifth pulley 665 is provided at an upper portion of the second pivot 642, and the sixth pulley 666 is provided at a lower portion of the third pivot 643. The fifth pulley 665 and the sixth pulley 666 are connected by the third belt 683. The seventh pulley 667 is provided at an upper portion of the third pivot 643. The eighth pulley 668 is provided at a lower portion of the fourth pivot 644. The seventh pulley 667 and the eighth pulley 668 are connected by the fourth belt 684. A rotatory power of the motor 620 is transferred to the first blade 112 through the first pulley 661, the first belt 681, the second pulley 662, the first pivot 641, the third pulley 663, the second belt 682, the fourth pulley 664, the second pivot 642, the fifth pulley 665, the third belt 683, the sixth pulley 666, the third pivot 643, the seventh pulley 667, the fourth belt 684, the eighth pulley 668, and the fourth pivot 644.

The second blade driver 700 may include a motor 720, first to fourth pivots 741 to 744, first to eighth pulleys 761 to 768, and first to fourth belts 781 to 784. The first pivot 741 is extended from an inner space of the lower link 132 to an inner space of the rotation body 150 through the inside of the first pivot 641 of the first blade driver 600. The second pivot 742 is extended up to an inner space of the lower link 132 through the inside of the second pivot 642 of the first blade driver 600. The third pivot 743 is extended from an inner space of the second arm 140 to an inner space of the upper link 134 through the inside of the third pivot 643 of the first blade driver 600. The fourth pivot 744 is extended downwards from a lower wall of a connection portion of the second blade 114 and is inserted in an inner space of the second arm 140. The first pulley 761 is connected with the motor 720, and the second pulley 762 is provided at a lower portion of the first pivot 741. The first pulley 761 and the second pulley 762 are connected by the first belt 781. The third pulley 763 is provided at an upper portion of the first pivot 741, and the fourth pulley 764 is provided at a lower portion of the second pivot 742. The third pulley 763 and the fourth pulley 764 are connected by the second belt 782. The fifth pulley 765 is provided at an upper portion of the second pivot 742, and the sixth pulley 766 is provided at a lower portion of the third pivot 743. The fifth pulley 765 and the sixth pulley 766 are connected by the third belt 783. The seventh pulley 767 is provided at an upper portion of the third pivot 743. The eighth pulley 768 is provided at a lower portion of the fourth pivot 744. The seventh pulley 767 and the eighth pulley 768 are connected by the fourth belt 784. A rotatory power of the motor 720 is transferred to the second blade 114 through the first pulley 761, the first belt 781, the second pulley 762, the first pivot 741, the third pulley 763, the second belt 782, the fourth pulley 764, the second pivot 742, the fifth pulley 765, the third belt 783, the sixth pulley 766, the third pivot 743, the seventh pulley 767, the fourth belt 784, the eighth pulley 768, and the fourth pivot 744.

Some example embodiments of the inventive concepts may include the lower link 132, the upper link 134, the second arm 140, the first blade 112, and the second blade 114, which are driven by drivers, respectively. In contrast, the lower link 132 and the upper link 134 may be extended such that they are driven by one driver, and the first and second blades 112 and 114 may be extended such that they are driven by one driver.

Figure 8:
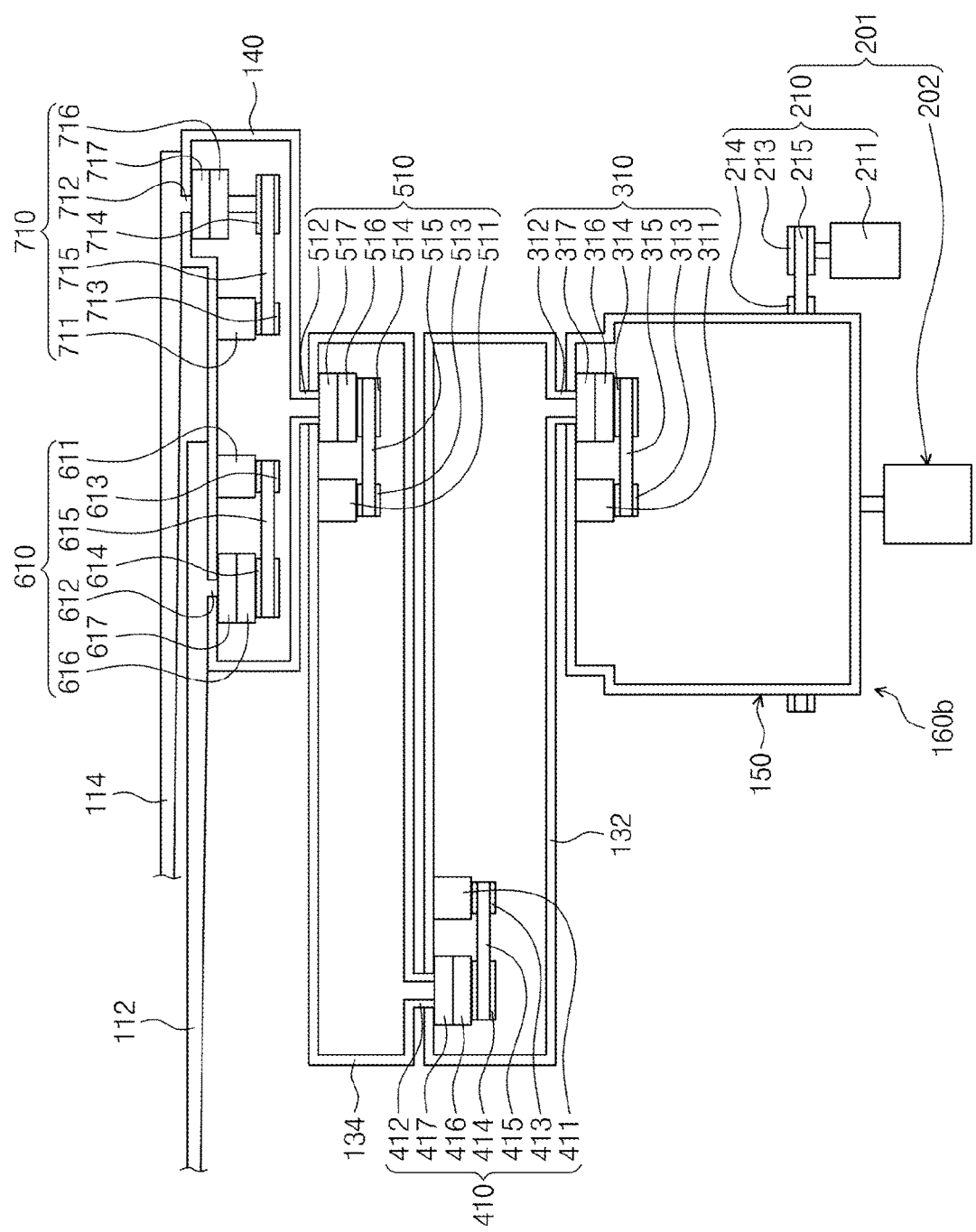
FIG. 8 illustrates a driving member of FIG. 4, according to an example embodiment of the inventive concepts.

FIG. 8 illustrates a driving member 160b of FIG. 4, according to some example embodiments of the inventive concepts.

Referring to FIG. 8, a driving member 160b may include a rotation body driver 201, a lower link driver 310, an upper link driver 410, a balance link driver 510, a first blade driver 610, and a second blade driver 710.

The rotation body driver 201 moves and rotates a rotation body 150. The rotation body driver 201 is outside the rotation body 150. The rotation body driver 201 may include a vertical movement unit 202 and a rotation driver 210. The vertical movement unit 202 moves the rotation body 150 in a vertical direction. The rotation driver 210 rotates the rotation body 150. In some example embodiments, the rotation body 210 may include a motor 211, a first pulley 213, a second pulley 214, and a belt 215. The motor 211 provides a driving force to the rotation body 150. The first pulley 213 is connected with the motor 211. The first pulley 213 is a motor pulley. The second pulley 214 is connected with the rotation body 150. The first pulley 213 and the second pulley 214 are connected by the belt 215.

The lower link driver 310 provides the lower link 132 with a rotatory driving power. The lower link driver 310 is in the rotation body 150 (on one inner surface thereof). The lower link driver 310 may include a motor 311, a pivot 312, a first pulley 313, a second pulley 314, a belt 315, a reducer 316, and a magnetic fluid seal 317. The motor 311 provides the lower link 132 with a rotatory driving power. The pivot 312 is mounted on one side of the lower link 132. The pivot 312 is extended into the rotation body 150. The motor 311 and the rotation body 312 are spaced from each other. The first pulley 313 is connected with the motor 311, and the second pulley 314 is connected with the reducer 316. The second pulley 314 may be substantially mounted on a pivot (not shown) of the reducer 316. The first pulley 313 and the second pulley 314 are connected by the belt 315. The reducer 316 is between the second pulley 314 and the pivot 312. The reducer 316 decelerates the number of revolutions of the second pulley 314. The reducer 315 adjusts the number of revolutions of the second pulley 314 and the pivot 312. The magnetic fluid seal 317 is between the reducer 316 and the pivot 312. The magnetic fluid seal 317 prevents or reduces leakage of air in the rotation body 150.

The upper link driver 410 is in the lower link 132 (on the other inner side thereof). The upper link driver 410 may include a motor 411, a pivot 412, a first pulley 413, a second pulley 414, a belt 415, a reducer 416, and a magnetic fluid seal 417. The motor 411 provides the upper link 134 with a rotatory driving power. The pivot 412 is connected with the motor 411. The pivot 412 is connected with the other side of the upper link 134. The pivot 412 is extended into the lower link 132. The second pulley 414 is connected with the reducer 416. The first pulley 413 and the second pulley 414 are connected by the belt 415. The reducer 416 is between the second pulley 414 and the pivot 412. The reducer 416 decelerates the number of revolutions of the second pulley 414 and the pivot 412. The reducer 416 may include a pivot (not shown) connected with the second pulley 414. The magnetic fluid seal 417 is provided at the pivot 412 between the reducer 416 and the upper link 134. The magnetic fluid seal 317 prevents or reduces leakage of air in the lower link 132.

The balance link driver 510 is in the upper link 134 (on one inner side thereof). The balance link driver 510 may include a motor 511, a pivot 512, a first pulley 513, a second pulley 514, a belt 515, a reducer 516, and a magnetic fluid seal 517. The motor 511 and the pivot 512 are spaced from each other. The pivot 512 is connected with a central portion of a second arm 140. The pivot 512 may be extended into the upper link 134. The first pulley 513 is connected with the motor 511. The first pulley 513 and the second pulley 514 are connected by the belt 515. The second pulley 514 is connected with the reducer 516 on the pivot 512. The magnetic fluid seal 517 is at the pivot 512 between the reducer 516 and the second arm 140.

The first blade driver 610 is in of the second arm 140 (on one inner side thereof). The first blade driver 610 may include a motor 611, a pivot 612, a first pulley 613, a second pulley 614, a belt 615, a reducer 616, and a magnetic fluid seal 617. The pivot 612 is connected with the first blade 112. The pivot 612 is extended into the second arm 140. The motor 611 and the pivot 612 are spaced from each other. The first pulley 613 is connected with the motor 611. The first pulley 613 and the second pulley 614 are connected by the belt 615. The second pulley 614 is connected with the reducer 616 on the pivot 612. The reducer 616 adjusts the number of revolutions of the second pulley 614 and the pivot 612. The magnetic fluid seal 617 is provided at the pivot 612 between the reducer 616 and the first blade 112. The magnetic fluid seal 617 is provided on one inner wall of the second arm 140. The pivot 612 penetrates the magnetic fluid seal 617. The magnetic fluid seal 617 prevents or reduces leakage of air in the second arm 140.

The second blade driver 710 is in of the second arm 140 (on the other inner side thereof). The second blade driver 710 may include a motor 711, a pivot 712, a first pulley 713, a second pulley 714, a belt 715, a reducer 716, and a magnetic fluid seal 717. The pivot 712 is connected with the second blade 114. The pivot 712 is extended into the second arm 140. The motor 711 and the pivot 712 are spaced from each other. The first pulley 713 is connected with the motor 711. The first pulley 713 and the second pulley 714 are connected by the belt 715. The second pulley 714 is connected with the reducer 716 on the pivot 712. The reducer 716 adjusts the number of revolutions of the second pulley 714 and the pivot 712. The magnetic fluid seal 717 is provided at the pivot 712 between the reducer 716 and the first blade 712. The magnetic fluid seal 717 is provided on the other inner wall of the second arm 140. The pivot 712 penetrates the magnetic fluid seal 717. The magnetic fluid seal 717 prevents or reduces leakage of air in the second arm 140.

Figure 9:
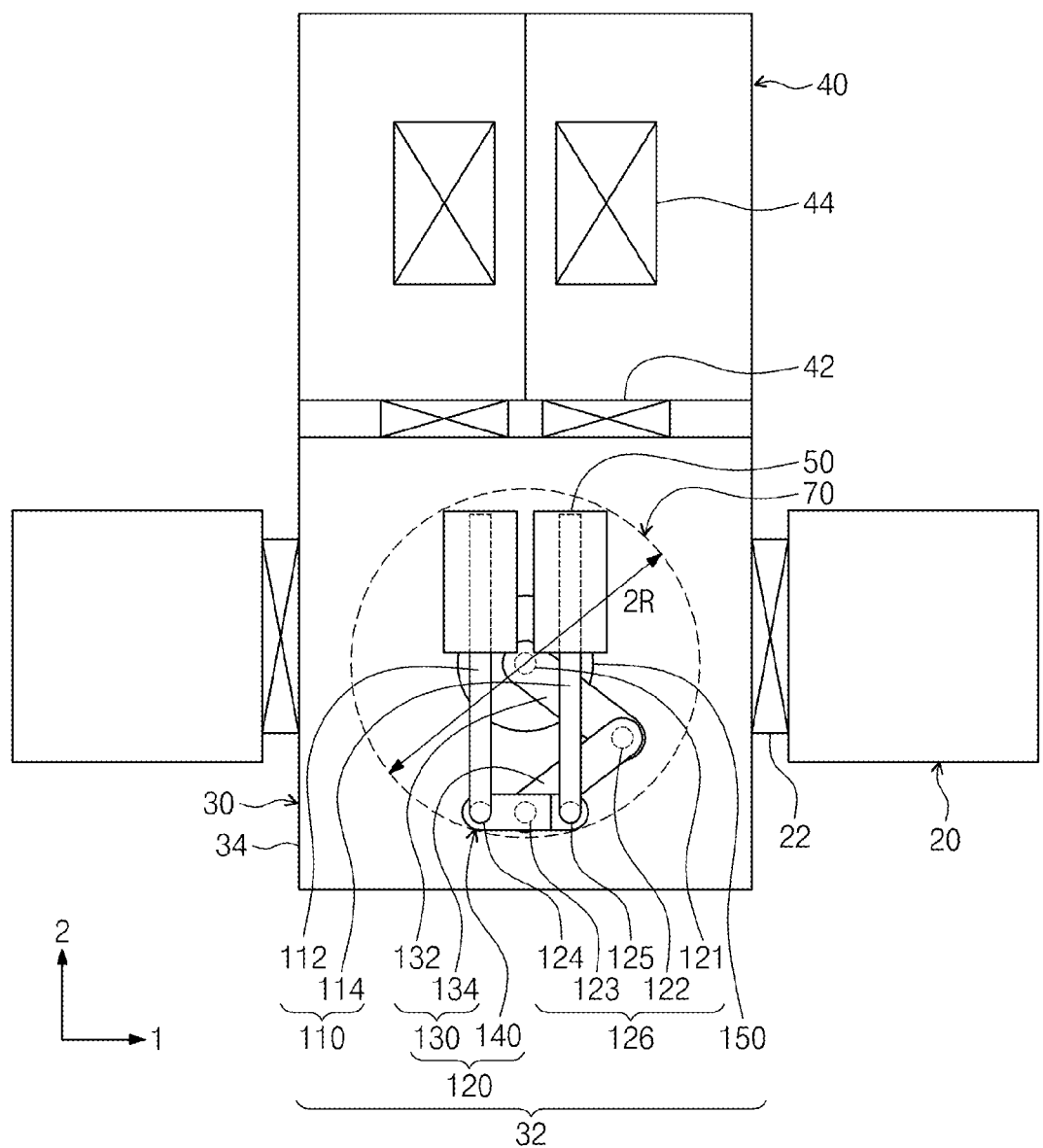
FIGS. 9 to 11 illustrate a transfer unit in a transfer chamber of FIG. 1.
Figure 10:
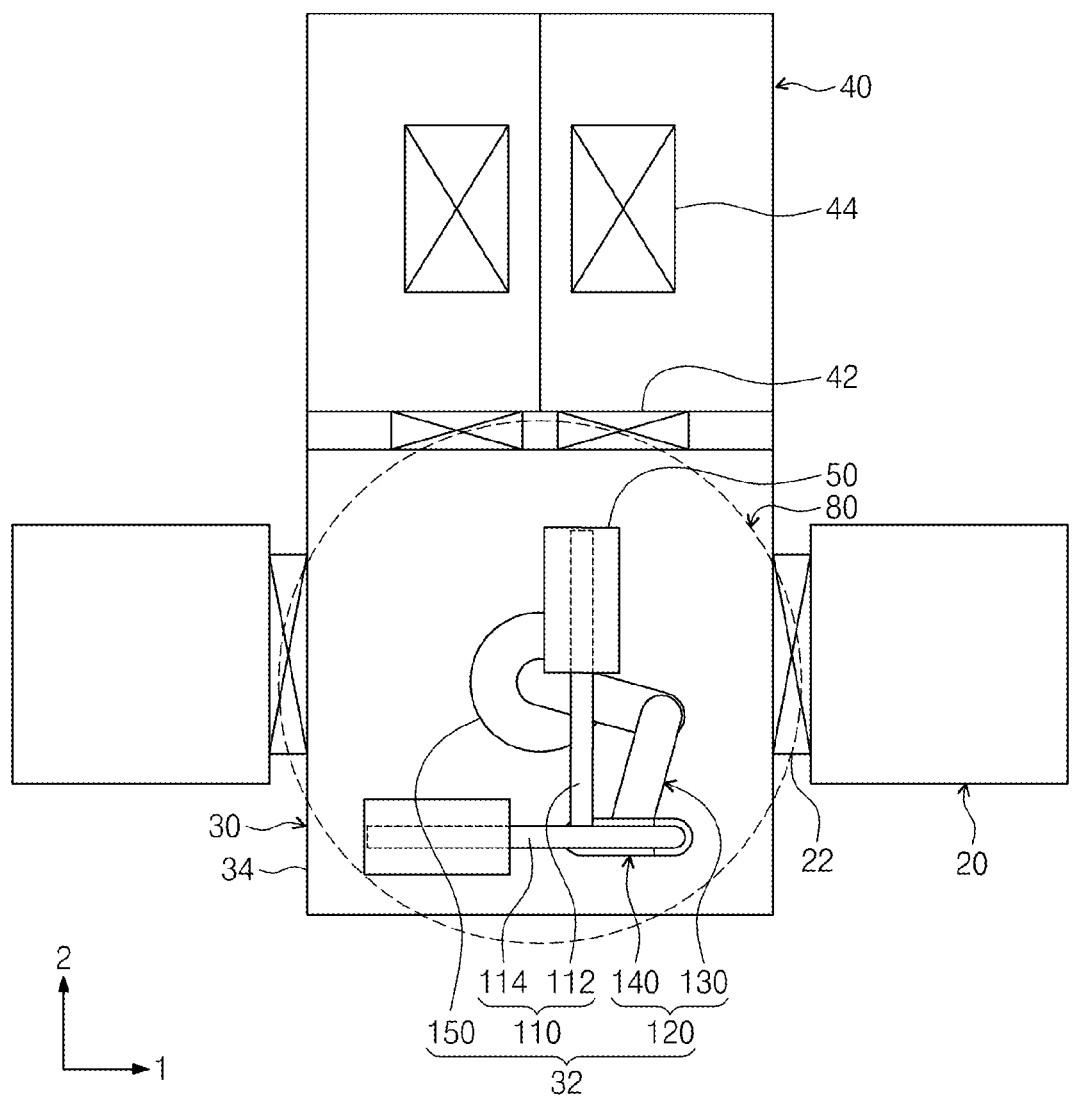
Figure 11:
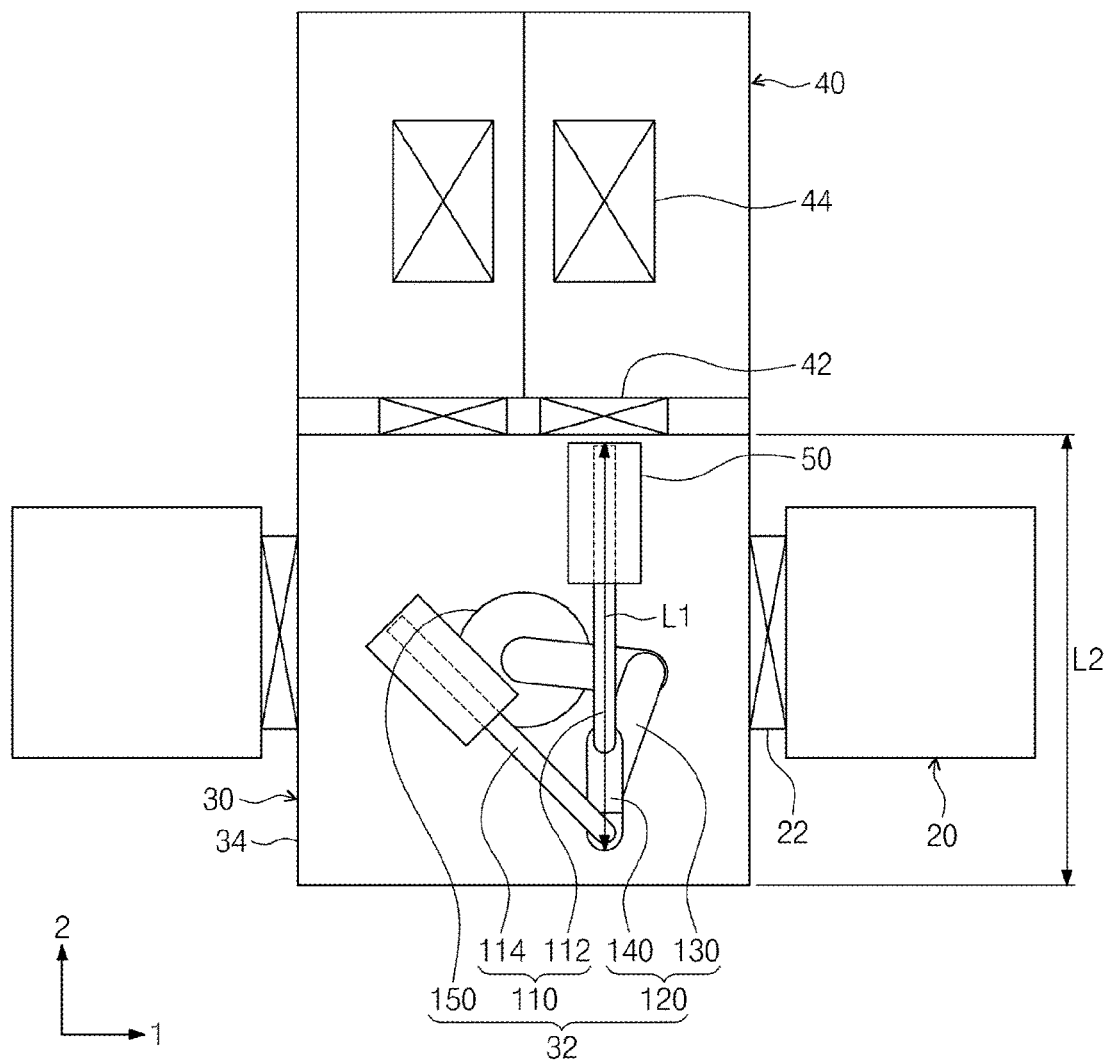

FIGS. 9 to 11 illustrate a transfer unit 32 in a transfer chamber 30 of FIG. 1.

Referring to FIGS. 9 to 11, a rotation body 150 is at a central portion of a transfer chamber 30. An arm member 120 and blades 110 rotate with the rotation body 150 as the center. When the arm member 120 and the blades 110 are overlapped, a rotatory area thereof is reduced. The rotatory area may correspond to an occupied area. In contrast, when the arm member 120 and the blades 110 are stretched, the rotatory area thereof is increased.

Lengths of the blades 110 are determined according to a substrate size. In contrast, lengths of the blades 110 may be determined according to magnitudes of buffer chambers 20 and process chambers 40. A length of the arm member 120 may be changed according to lengths of the blades 110. In the event that a first arm 130 is longer than the blades 110, an operation of the first arm 130 in the transfer chamber 30 is restricted. For example, a lower link 132 and an upper link 134 may have the same length. In the lower link 132, a distance from a first pivot 121 to a second pivot 122 may be about 1300 mm. In the upper link 134, a distance from the second pivot 122 to a third pivot 123 may be about 1300 mm. In a second arm 140, a distance from a fourth pivot 124 to a fifth pivot 125 may be about 900 mm. A distance from the fourth pivot 124 to the end of the first blade 112 may be about 3150 mm. A distance from the fifth pivot 125 to the end of the second blade 114 may be about 3150 mm. The blades 110 may be controlled in a direction intersecting a parallel direction in the transfer chamber 30. The parallel direction may be a direction where the blades 110 are in the same direction (i.e., a second direction 2) at both sides of a rotation body 150. The intersecting direction may not be the parallel direction.

Referring to FIG. 9, when the blades 110 are parallel, a transfer unit 32 has a minimum and/or desired rotatory area 70. The blades 110 are in the second direction 2. The rotation body 150 is between the blades 110. The second arm 140 is in a first direction 1. The second arm 140 is in a direction perpendicular to the blades 110. Distances between the rotation body 150 and the blades 110 are identical to each other. The minimum and/or desired rotatory area 70 may be an area where parallel blades 110 rotate with the rotation body 150 as the center. The parallel blades 110 may rotate in the minimum and/or desired rotatory area 70. A diameter 2R of the minimum and/or desired rotatory area 70 may be greater than lengths of the blades 110. The minimum and/or desired rotatory area 70 may correspond to a minimum and/or desired occupied area.

In some example embodiments, side walls 34 of the transfer chamber 30 may have a regular polygon shape. For example, the side walls 34 may have a square shape. The side walls 34 correspond to edges of the square. The transfer chamber may include the side walls 34 of which the lengths are longer than the diameter 2R of the minimum and/or desired rotatory area 70. The transfer unit 32 rotates without collision when the diameter 2R of the minimum and/or desired rotatory area 70 of the transfer unit 32 is shorter than a length of each of the side walls 34. The length of the side wall 34 is longer than that of each blade 110. Although not shown, the blades 110 rotate in the same direction with the rotation body 150 as the center. In contrast, the blades 110 move in the minimum and/or desired rotatory area 70 in an intersecting direction.

Referring to FIG. 10, when positioned in an intersecting direction, the blades 110 provide the process chambers 40 with substrates 50, respectively. For example, the blades 110 may have a generally "T" shape. The first blade 112 is in a second direction 2, and the second blade 114 is in a first direction 1. The first blade 112 is in front of one of the process chambers 140. The second blade 114 is adjacent to one of the buffer chambers 20. The second blade 114 may be overlapped with the second arm 140. Although not shown, when the first blade 112 is inserted in one of the process chambers 40, the second blade 114 is controlled to be movable in the first direction 1. The blades 110 provide substrates 50 to either the process chambers 40 or the buffer chambers 20, independently. The blades 110 may be in an intersecting direction. The blades 110 move in the same direction, with the blades 140 intersected.

Referring to FIGS. 9 and 10, when the blades 110 are in an intersecting direction, a rotatory area 80 of the blades 110 is larger than the minimum and/or desired rotatory area 70. The rotatory area 80 may be an area where intersected blades 110 rotate with the rotation body 150 as the center. The intersected blades 110 rotate in the rotatory area 80. In the event that the rotatory area 80 is wider than an area of the transfer chamber 30, the transfer unit 32 collides with the side walls 34 of the transfer chamber 30. For this reason, as illustrated in FIG. 9, the blades 110 are set to be parallel with each other and then rotate with the rotation body 150 as the center. Switching of directions of the blades 110 will be more fully described with reference to a substrate treating method.

Referring to FIGS. 9 and 11, the transfer chamber 30 may have the side walls 34 of which the lengths are longer than a straight line length L1 of one of the blades 110 and the second arm 140 in line. The straight line length L1 may be a sum of lengths of the first blade 112 and the second arm 140 in line. The straight line length L1 may be a sum of a distance from a fourth pivot 124 to the end of the first blade 112 and a distance from the fourth pivot 124 to the end of the second arm 140 adjacent to a fifth pivot 125. Similarly, the straight line length L1 may be a sum of lengths of the second blade 114 and the second arm 140 in line. The straight line length L1 may be a sum of a distance from the fifth pivot 125 to the end of the second blade 114 and a distance from the fifth pivot 125 to the end of the second arm 140 adjacent to the fourth pivot 124. That is, when one of the blades 110 is in line with the second arm 140, the straight line length L1 may correspond to a length from one edge of the second arm 140 to the other edge of one of the blades 110.

Length L2 of the side walls 34 may be longer than the straight line length L1. Nevertheless, the length L2 of the side walls 34 can decrease up to a diameter 2R of a minimum and/or desired rotatory area 70 of the blades 110 and the second arm 140.

Figure 12:
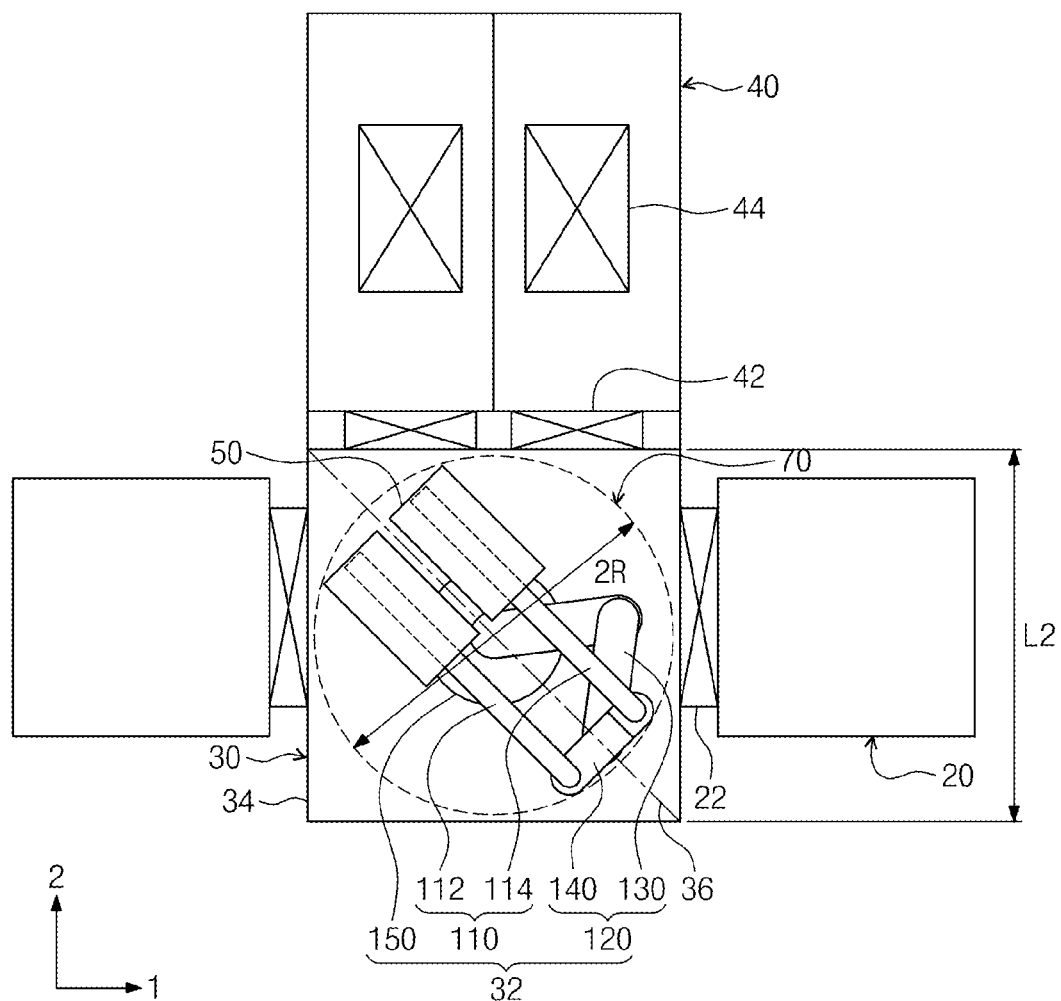
FIGS. 12 and 13 illustrate a transfer chamber including side walls 34 of which the lengths are reduced to correspond to a diameter of a minimum and/or desired rotatory area of FIG. 9, according to an example embodiment of the inventive concepts.
Figure 13:
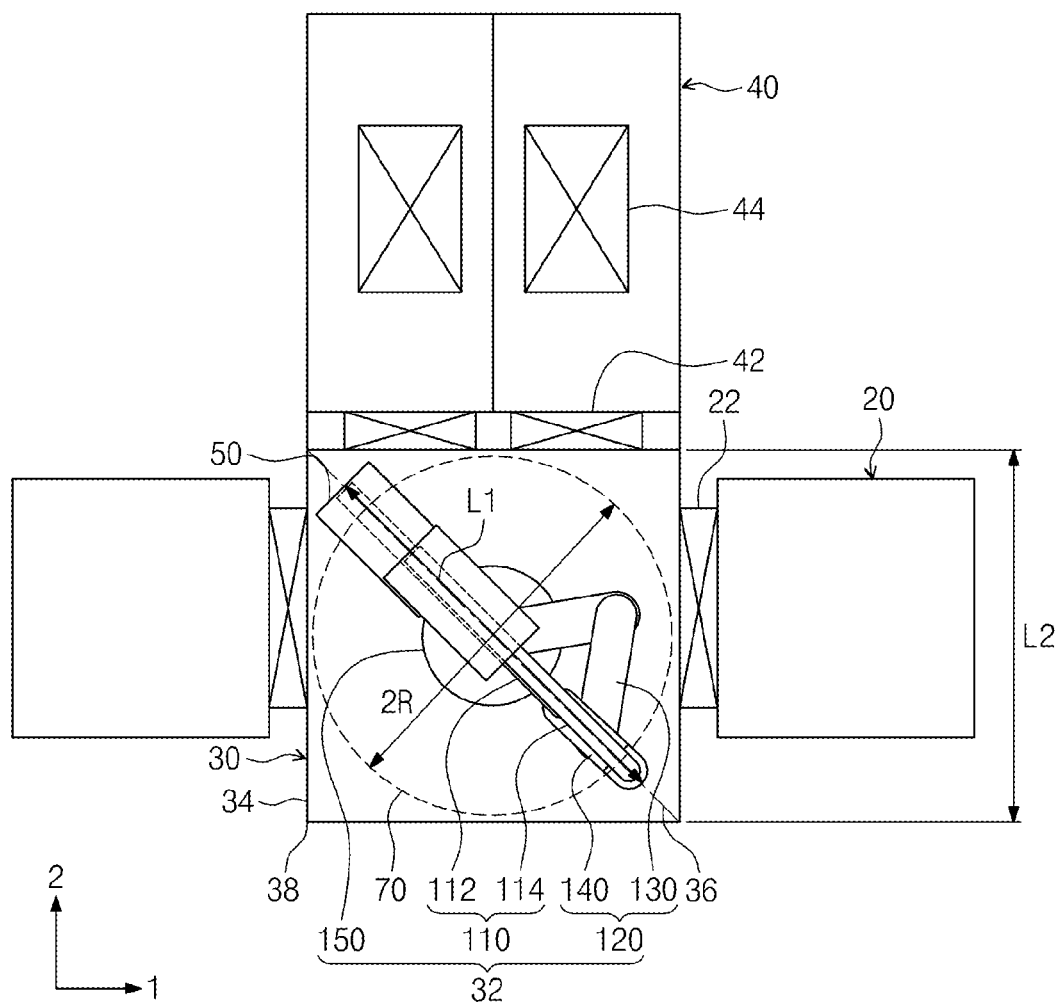

FIGS. 12 and 13 illustrate a transfer chamber 30 including side walls 34 of which the lengths are reduced to correspond to a diameter 2R of a minimum and/or desired rotatory area 70 of FIG. 9, according to some example embodiments of the inventive concepts.

Referring to FIG. 12, a length L2 of a transfer chamber 30 is equal to a diameter 2R of a minimum and/or desired rotatory area 70. Blades 110 are in a direction of a diagonal line 36. The blades 110 are at both sides of the diagonal line 36.

Referring to FIG. 13, left and right positions of the blades 110 are switched at a corner 38 of a transfer chamber 30. The blades 110 and a second arm 140 are on the diagonal line 36. The blades 110 are overlapped on the diagonal line 36. Left and right positions of the first and second blades 112 and 114 are switched on the basis of the diagonal line 36. Accordingly, it is possible to switch left and right positions of the blades 110 on the diagonal line 36.

The first blade 112 and the second arm 140 are stretched in line. A straight line length L1 of the first blade 112 and the second arm 140 may be longer than a diameter 2R of a minimum and/or desired rotatory area 70. Length L2 of the side walls 34 may be shorter than a straight line length L1 of the first blade 112 and the second arm 140.

Figure 14:
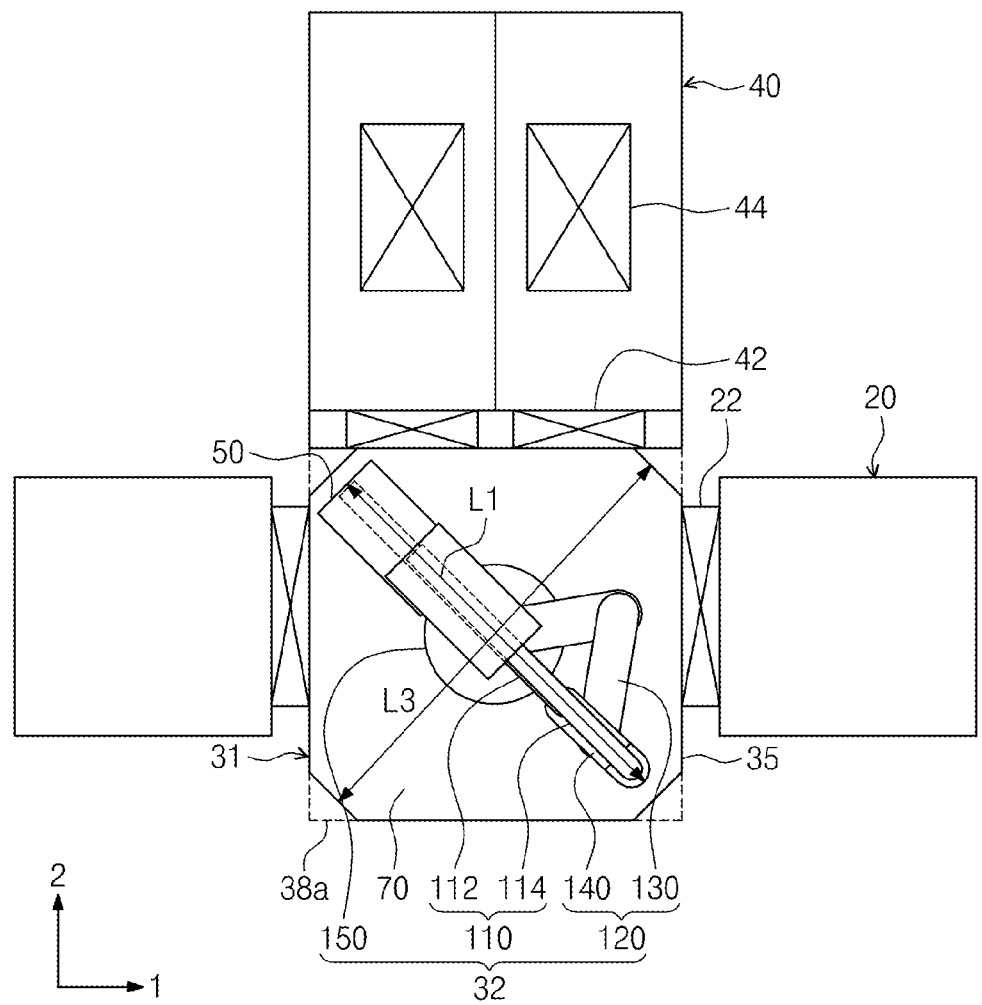
FIG. 14 illustrates a transfer chamber of FIG. 13, according to another example embodiment of the inventive concepts.

FIG. 14 illustrates a transfer chamber 31 of FIG. 13, according to some example embodiments of the inventive concepts.

Referring to FIG. 14, a transfer chamber 31 may include side walls 35 that constitute an octagonal shape formed by cutting the corners 38a of a square. A straight line length L1 of a second arm 140 and one of blades 110 may be shorter than a length L3 of a diagonal line 36. Even though the length L3 of the diagonal line 36 of the square becomes shorter than the straight line length L1, it is possible to switch positions of the blades 110. If the length L3 of the diagonal line 36 is over the straight line length L1, the corners 38a of the transfer chamber 31 may be cut. Accordingly, the transfer chamber 31 has a square shape of which the corners 38a are cut and which has the length L3 of the diagonal line 36 longer than the straight line L1. Alternatively, the corners 38a of the square may be rounded.

Below, there will be described a substrate treating method using a substrate treating apparatus 100 according to some example embodiments of the inventive concepts.

Figure 15:
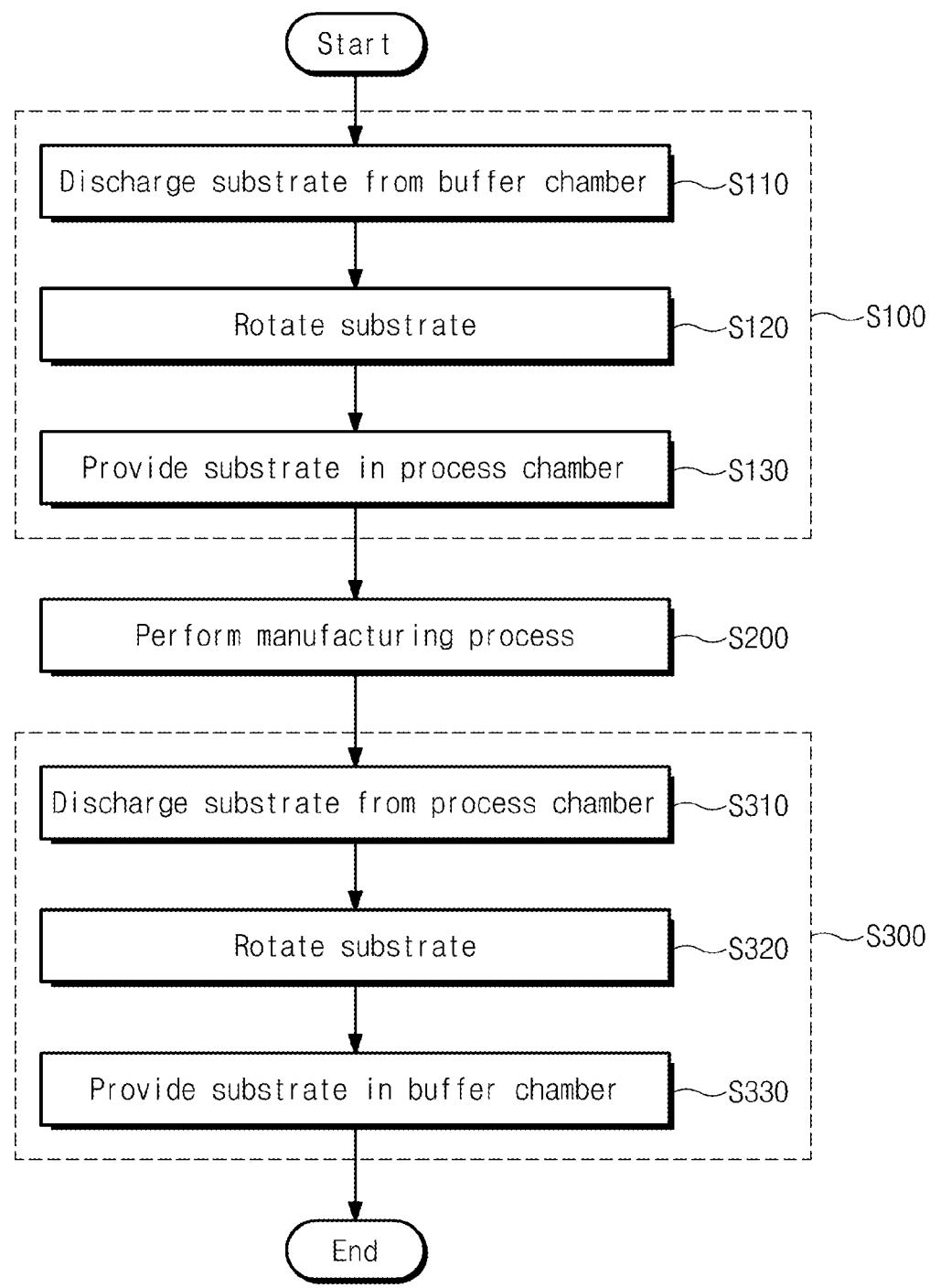
FIG. 15 is a flowchart schematically illustrating a substrate treating method.
Figure 16:
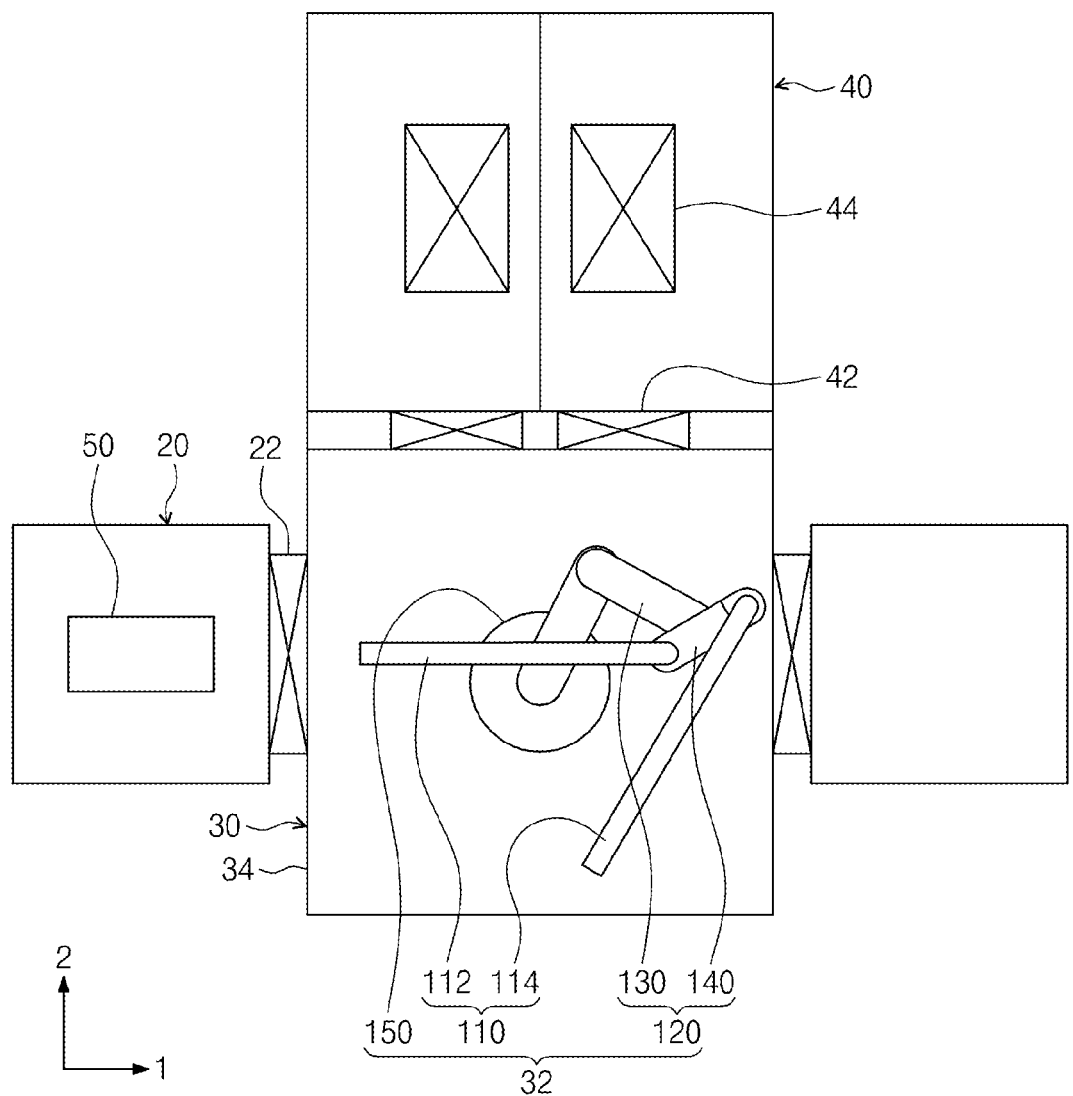
FIGS. 16 to 28 illustrate an operation of a transfer unit according to a substrate treating method of FIG. 15.
Figure 17:
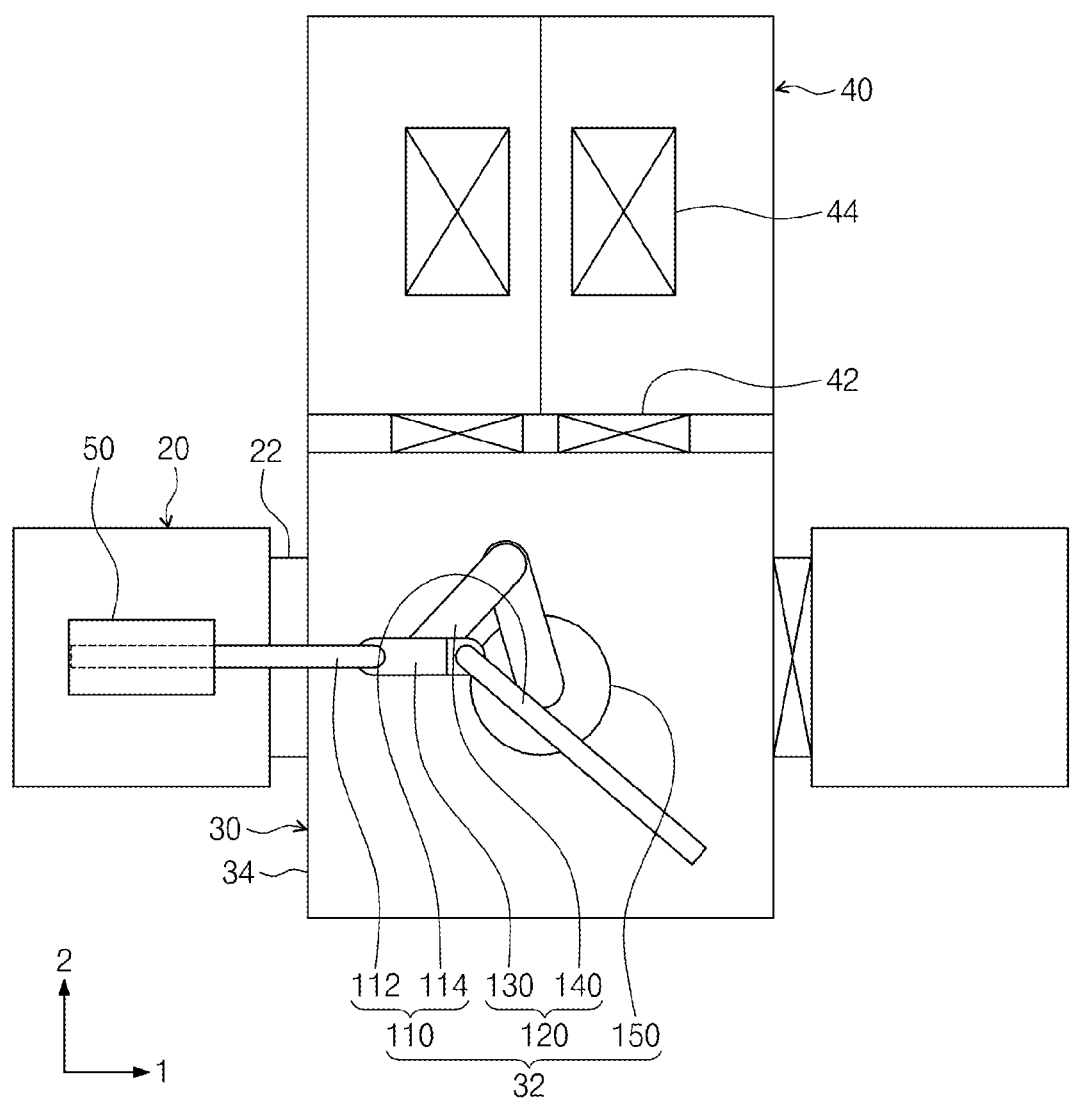
Figure 18:
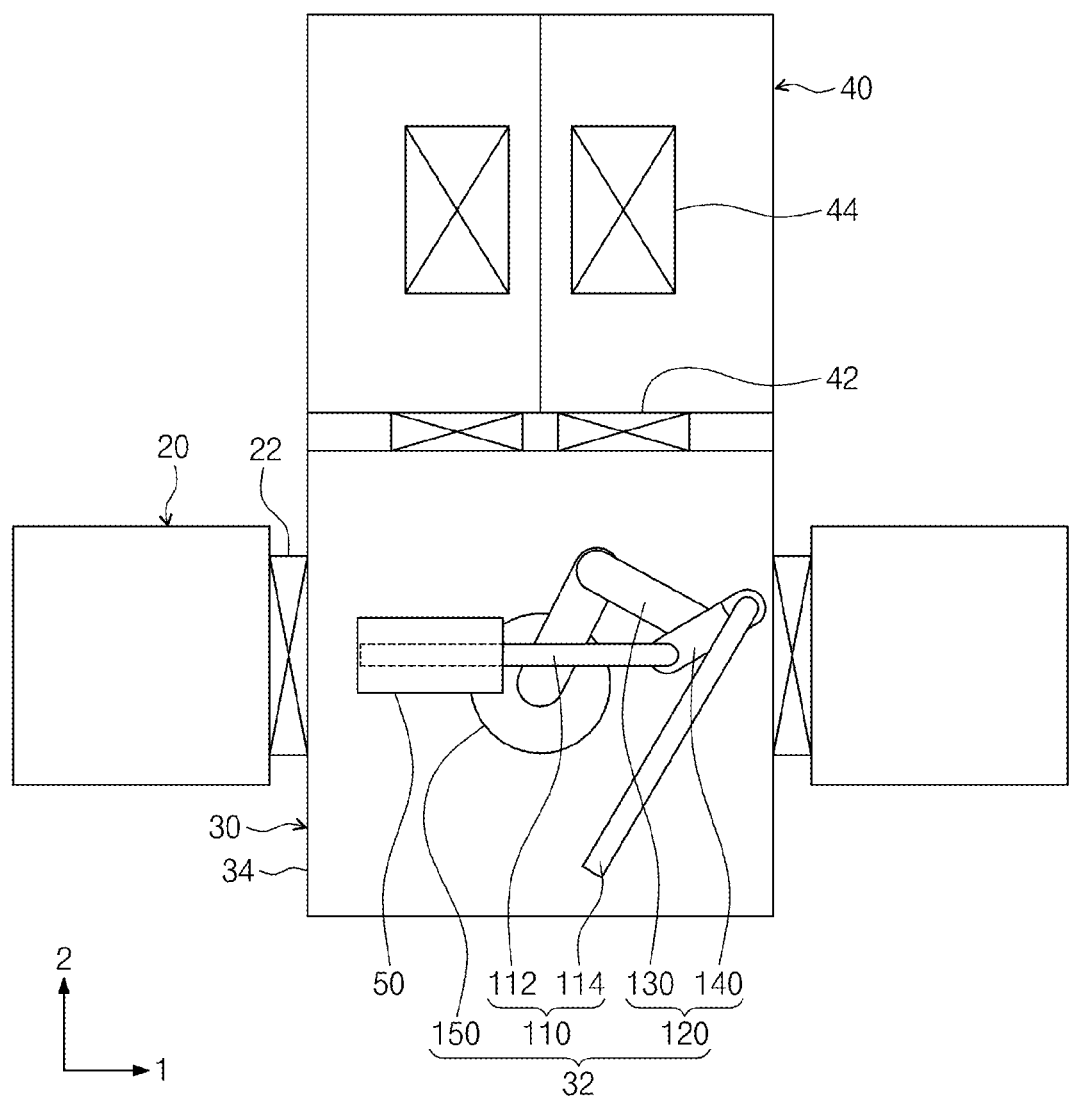

FIG. 15 is a flowchart schematically illustrating a substrate treating method.

Referring to FIG. 15, a substrate treating method may include a loading step S100, a manufacturing step S200, and an unloading step S300. The loading step S100 is a step of providing substrates 50 from buffer chambers 20 to process chambers 40. The manufacturing step S200 is a step of performing a manufacturing process about the substrates 50 in the process chambers 40. The unloading step S300 is a step of transferring the substrates 50 from the process chambers 40 to the buffer chambers 20.

The loading step S100 may include steps of discharging the substrates 50 from the buffer chambers 20 (S110); rotating the substrates 50 (S120); and providing the substrates 50 in the process chambers 40 (S130). The step S110 of discharging the substrates 50 from the buffer chambers 20 may be a step of transporting the substrates 50 in the buffer chambers 20 to the transfer chamber 30. The step S120 of rotating the substrates 50 is a step where positions of the substrates 50 in the transfer chamber 30 are switched. The substrates 50 may be transported from the front of the buffer chamber 20 to the front of the process chamber 40 in the transfer chamber 30. The step S130 of providing the substrates 50 in the process chambers 40 is a step of providing the substrates 50 in the process chambers 40.

During manufacturing (S200), a transfer unit 32 waits in the transfer chamber 30. In contrast, the transfer unit 32 may load or unload other substrates 50 in or from process chambers 40 where a manufacturing process is not performed.

The unloading step S300 may include steps of discharging the substrates 50 from the process chambers 40 (S310); rotating the substrates 50 (S320); and providing the substrates 50 to the buffer chamber 20 (S330). The step S310 of discharging the substrates 50 from the process chambers 40 is a step of transporting the substrates 50 from the process chambers 40 to the transfer chamber 30. The step S320 of rotating the substrates 50 is a step of transporting the substrates 50 the front of the process chamber 40 to the front of the buffer chamber 20 in the transfer chamber 30. The step S330 of providing the substrates 50 in the buffer chambers 20 is a step of providing the substrates 50 in the buffer chambers 20.

FIGS. 16 to 28 illustrate an operation of a transfer unit 32 according to a substrate treating method of FIG. 15.

Referring to FIGS. 15 to 18, a transfer unit 32 transports a substrate 50 in a buffer chamber 20 into a transfer chamber 30 (S110). Blades 110 are in an intersecting direction. In some example embodiments, the first blade 112 is in a first direction 1. The second blade 114 is in a direction between the first direction 1 and a second direction 2. Although not shown, if the second blade 114 and a second arm 140 are overlapped, the second blade 114 may be in the second direction 2. When the blades 110 are in an intersecting direction, the substrate 50 is transported from the buffer chamber 20 to the transfer chamber 30. When the blades 110 are in an intersecting direction, a rotatory area of the blades 110 may be greater than an inner area (not shown) of the transfer chamber 30.

Figure 19:
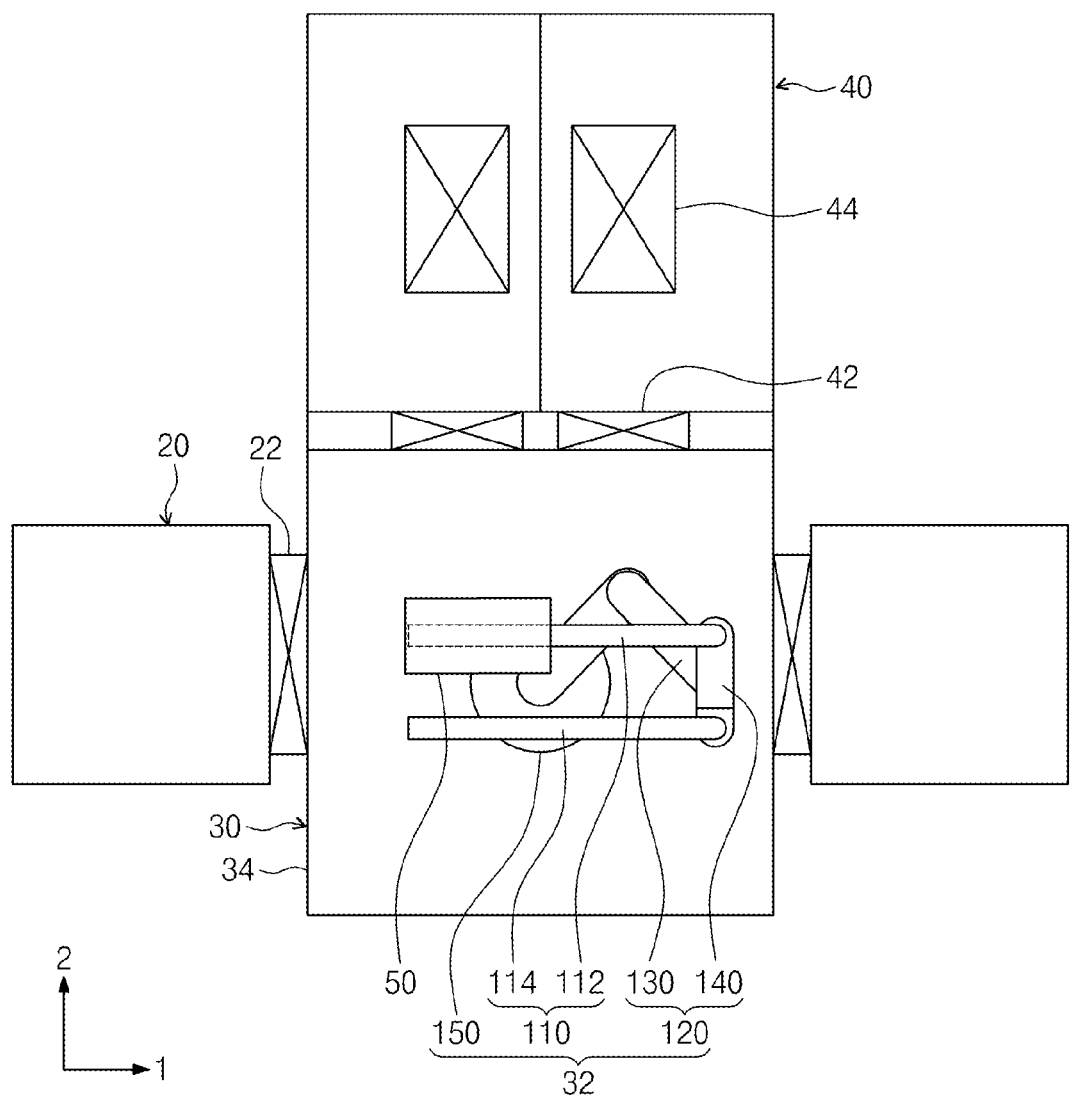
Figure 20:
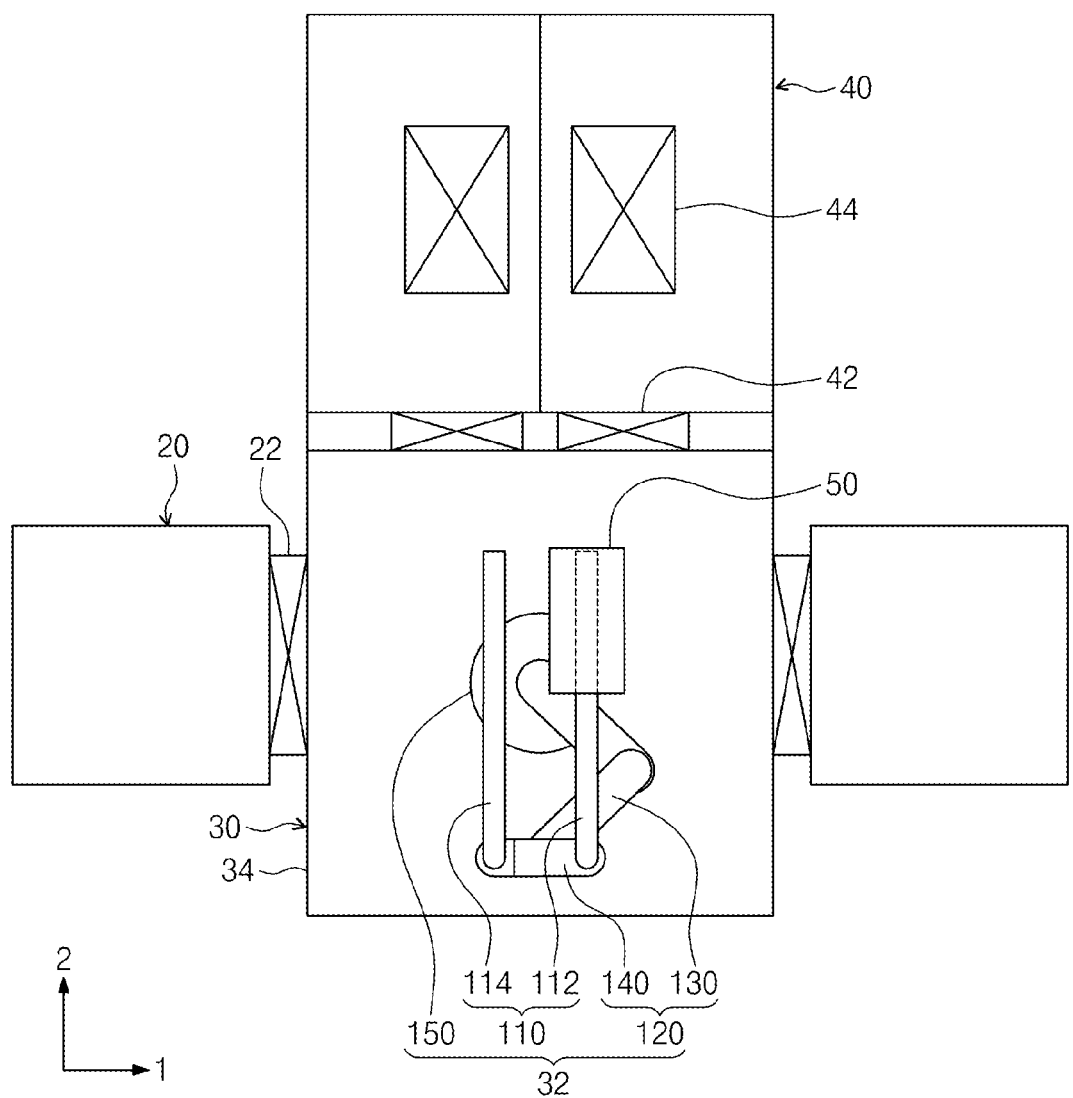

Referring to FIGS. 15, 19, and 20, the blades 110 are to be parallel with each other and rotate with a rotation body 150 as the center (S120). First, the blades 110 are to be parallel along the first direction 1. Next, the blades 110 rotate from the first direction 1 to the second direction 2. The rotation body 150 may correspond to a rotatory center of the blades 110.

Figure 21:
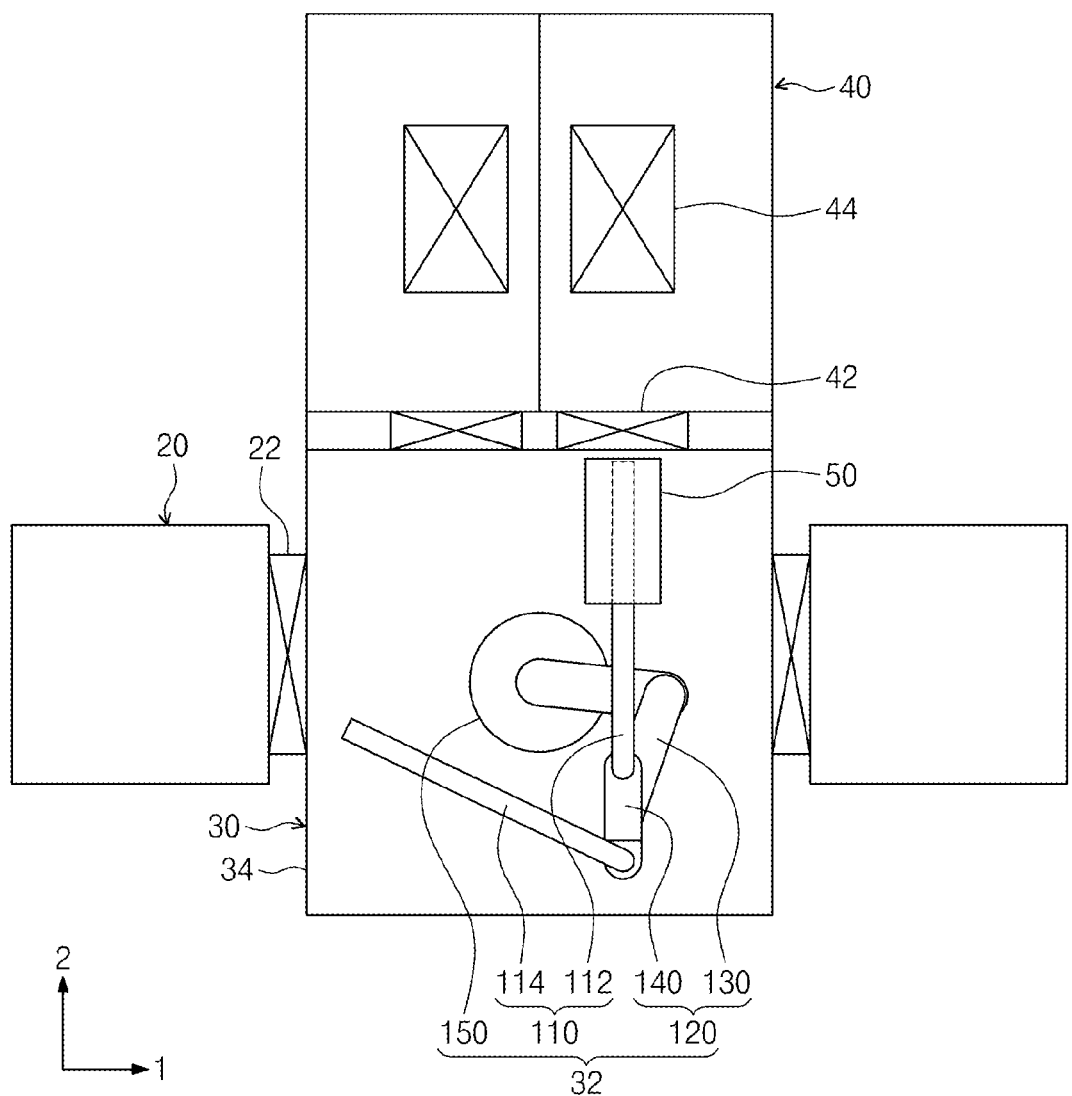

Referring to FIG. 21, the second blade 114 again rotates in the first direction 1. The first blade 112 is in the second direction 2. The blades 110 are in an intersecting direction.

In contrast, referring to FIGS. 19 and 21, the blades 110 are parallel along the first direction 1, and the first blade 112 rotates in the second direction 2. The second blade 114 is in a direction between the first direction 1 and the second direction 2. Accordingly, the blades 110 are in an intersecting direction.

Figure 22:
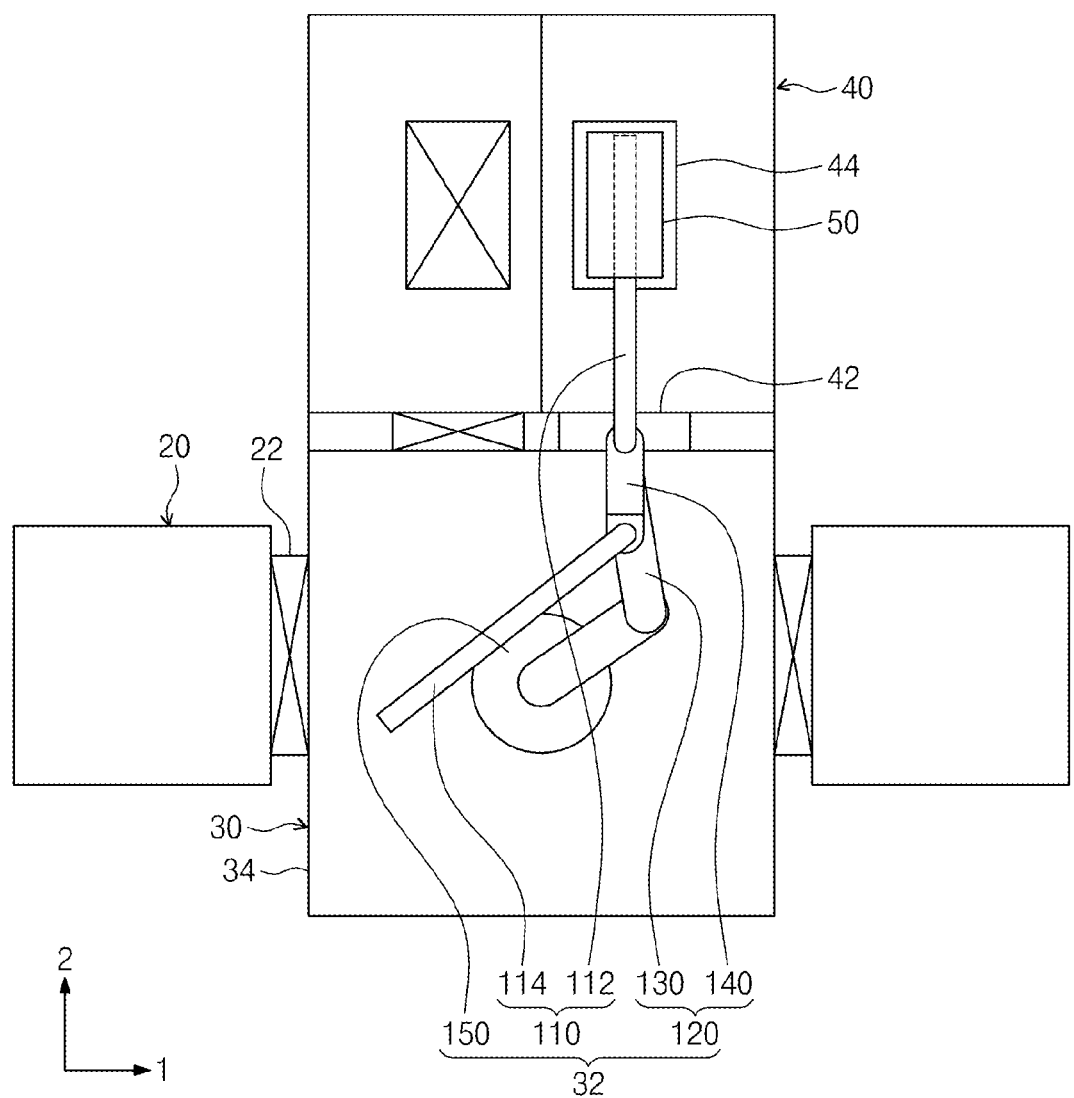
Figure 23:
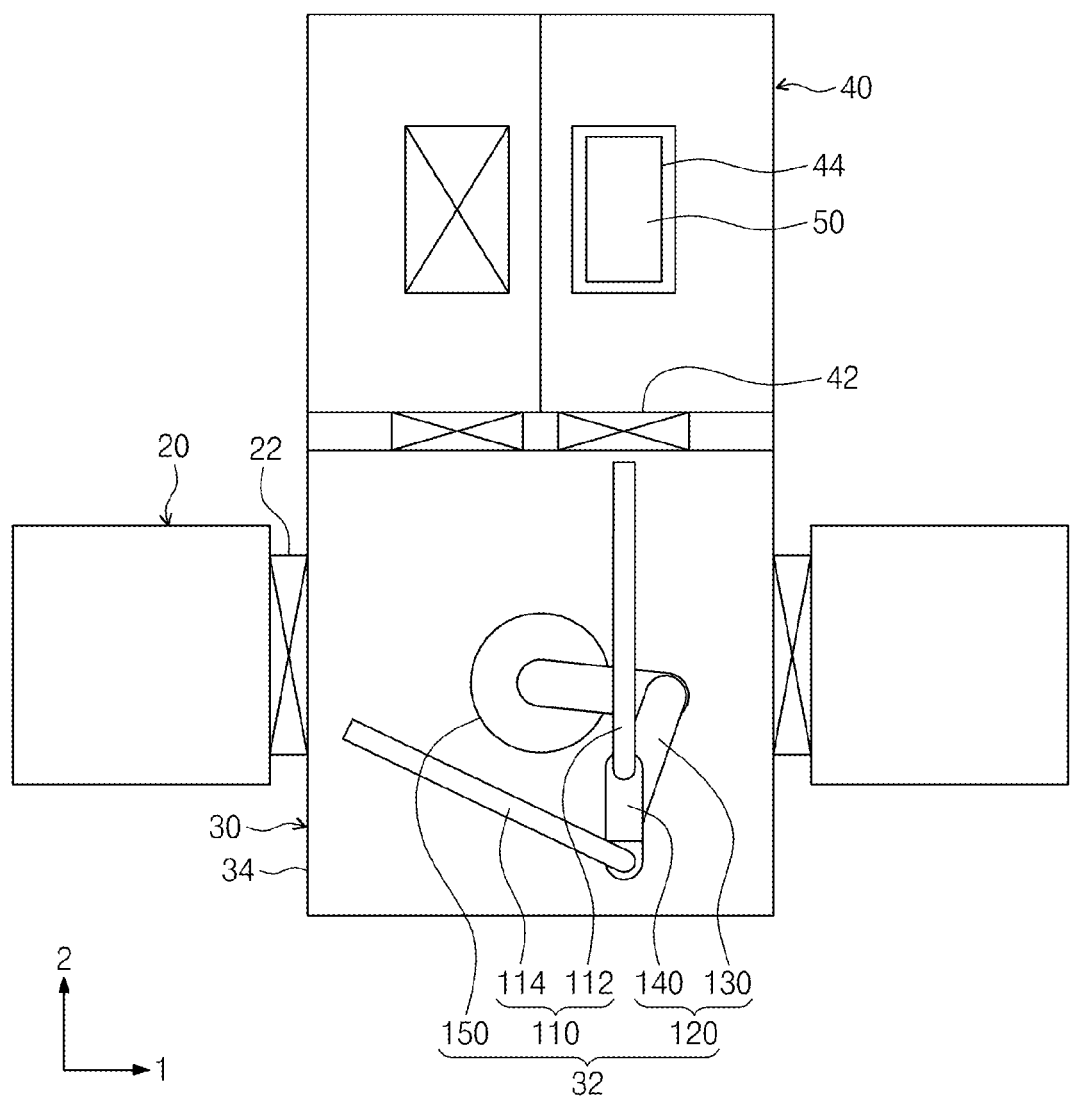

Referring to FIGS. 15, 22, and 23, the transfer unit 32 transports the substrate 50 from the transfer chamber 30 to the process chamber 40 (S130). The first blade 112 is in the second direction 2. The second blade 114 is between the first direction 1 and the second direction 2. When overlapped with the second arm 140, the second blade 114 is in the first direction 1.

When the first blade 112 returns to the transfer chamber 30, the process chamber 40 performs a manufacturing process about the substrate 50 (S200). When the manufacturing process about the substrate 50 is completed, the first blade 112 unloads the substrate 50 from the process chamber 40 to the buffer chamber 20 in a reverse order of the above-described loading operation.

Referring to FIGS. 15, 22, and 23, when the blades 110 are in an intersecting direction, the first blade 112 transports the substrate 50 from the process chamber 40 to the transfer chamber 30 (S310). The first blade 112 is in the second direction 2, and the second blade 114 is in a direction between the first direction 1 and the second direction 2. The blades 110 are in an intersecting direction.

Figure 24:
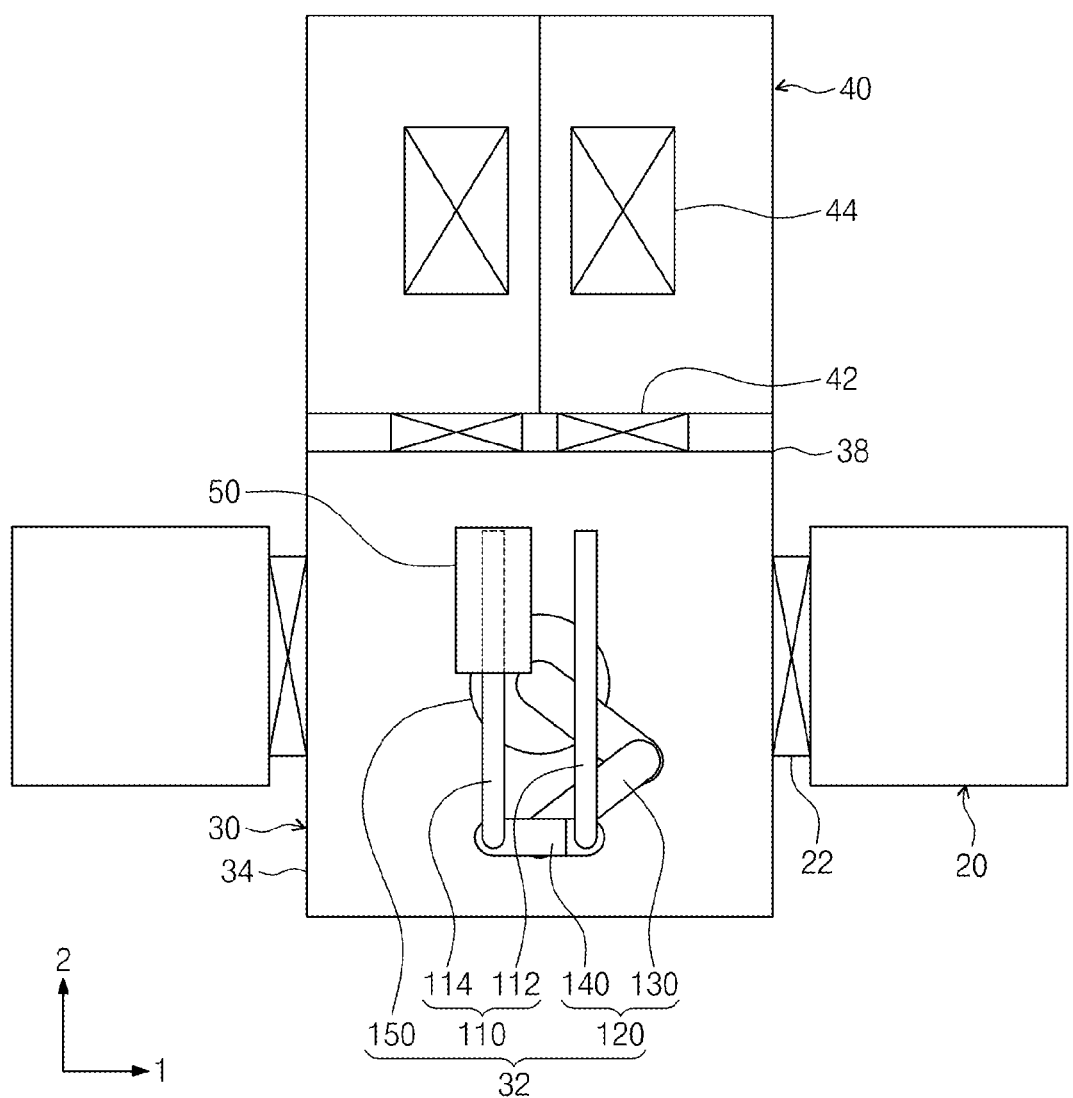

Referring to FIGS. 21 and 24, left and right positions of the blades 110 are switched. As the second arm 140 rotates, positions of the blades 110 are switched. The blades 110 are parallel along the second direction 2. Positions of the blades 110 may be changed according to a connection position of the buffer chambers 20 and the process chambers 40 with respect to the transfer chamber 30. For example, when the process chambers 40 and the buffer chamber 20 are adjacent to a corner 38 of the transfer chamber 30, left and right positions of the blades 110 are switched.

Figure 25:
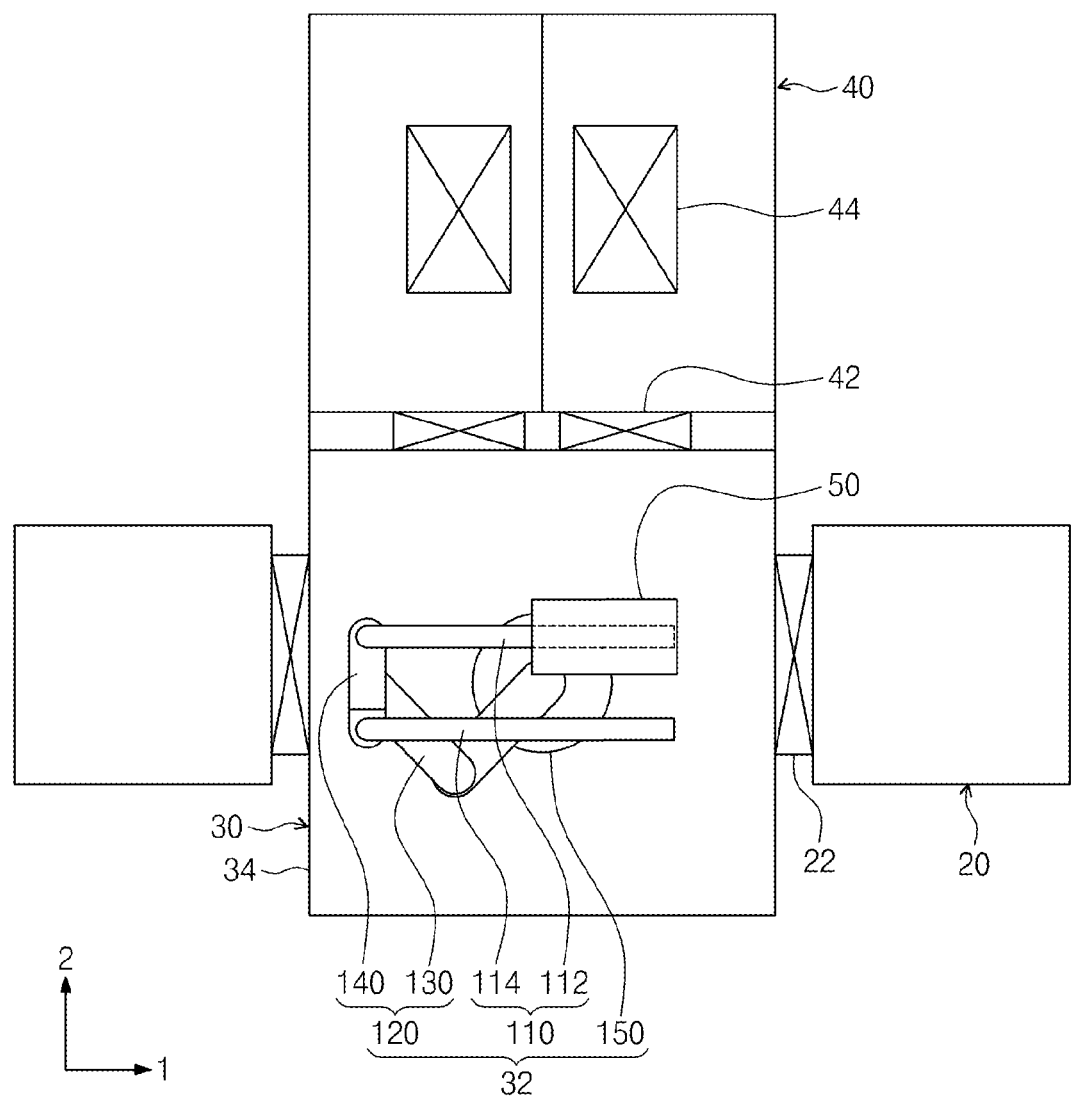
Figure 26:
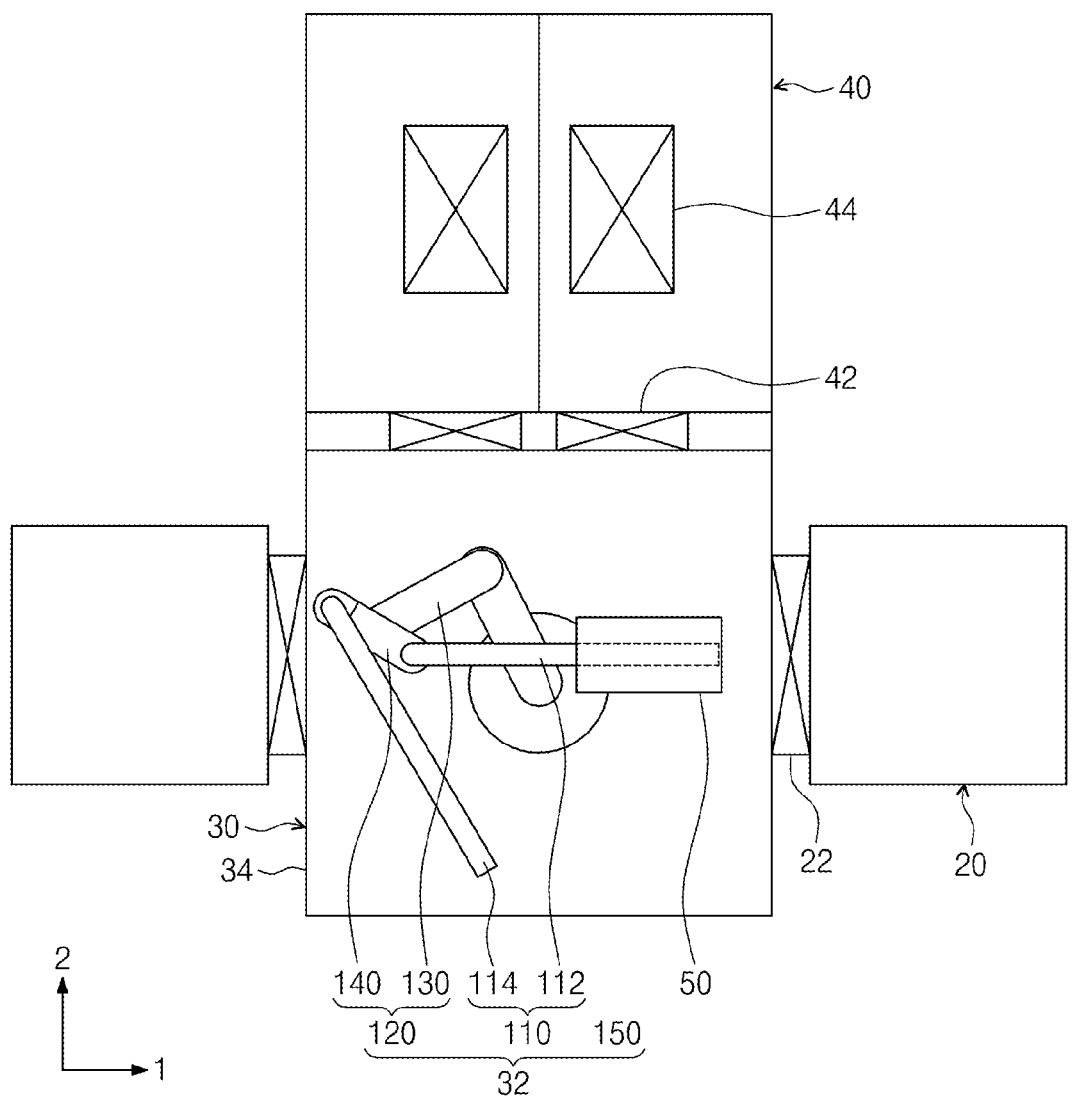

Referring to FIGS. 15, 25, and 26, the blades 110 rotate in the first direction (S320). The blades 110 are in the first direction 1. Next, the second blade 114 rotates in a direction between the first direction 1 and the second direction 2. The blades 110 are rotated from a parallel direction to an intersecting direction. Here, the intersecting direction may be comprehended to include a state where one blade is overlapped with the other blade, a state where one blade is overlapped with a virtual line extending from the other blade, etc.

Figure 27:
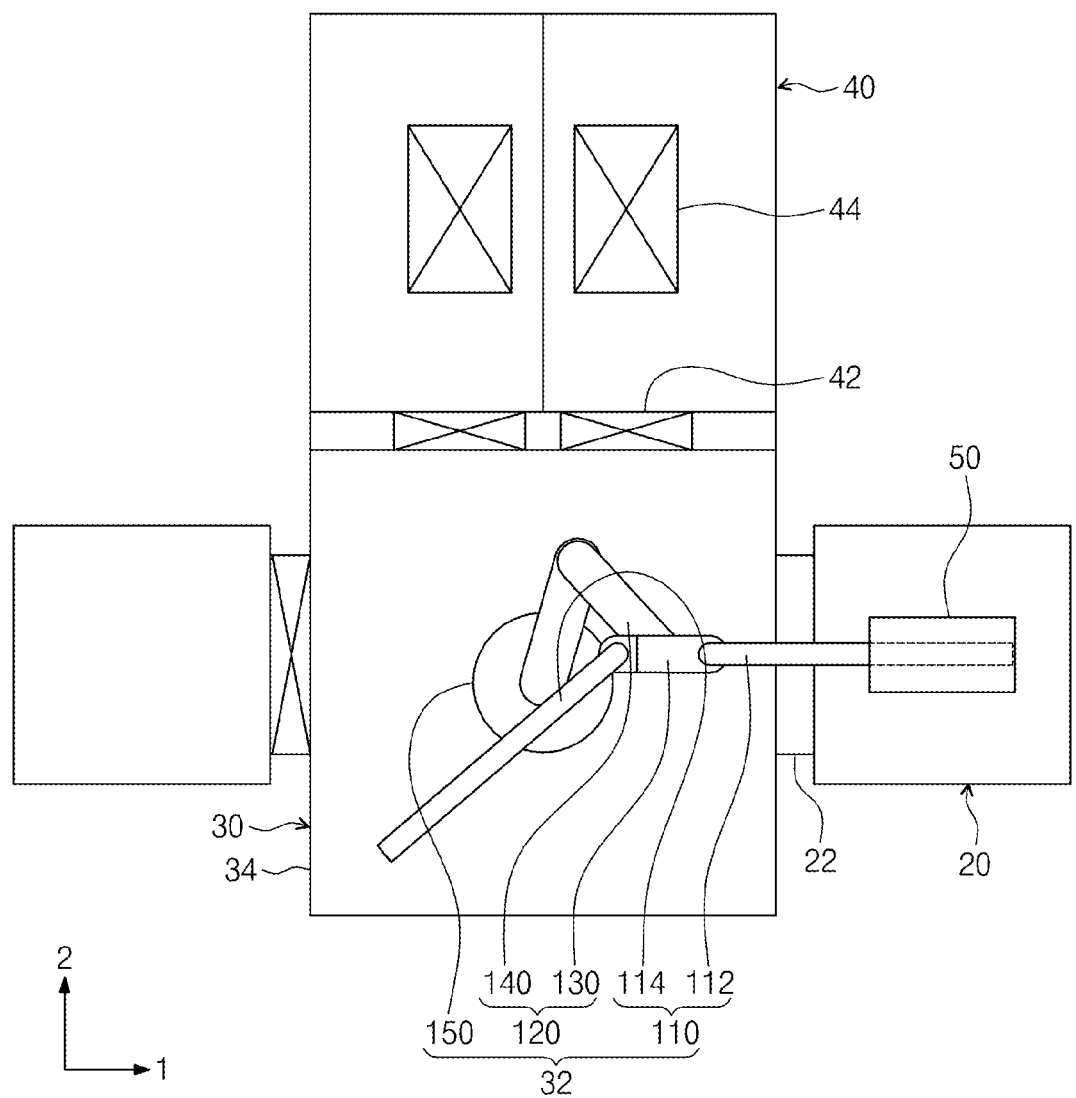
Figure 28:
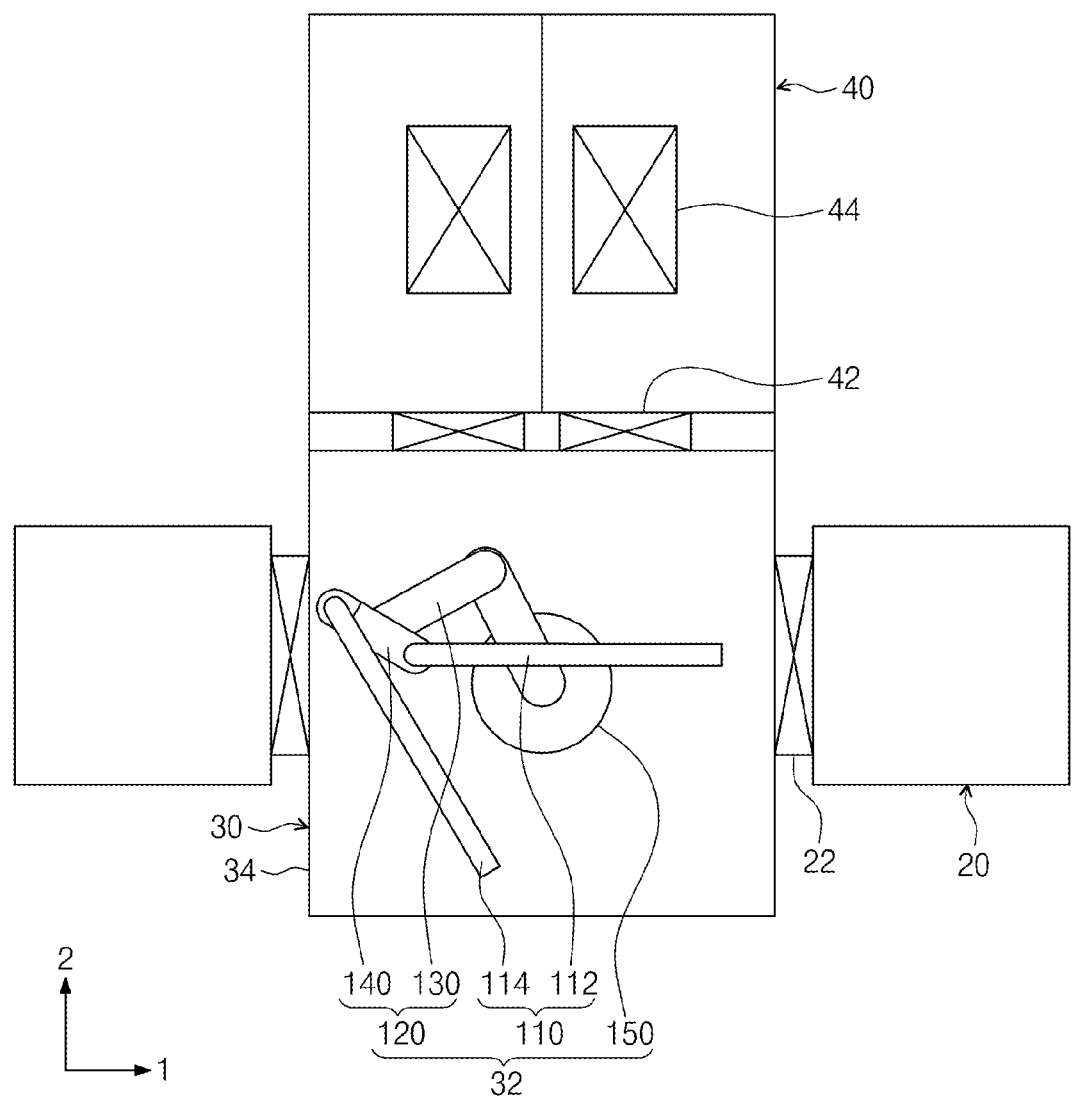

Referring to FIGS. 15, 27, and 28, the first blade 112 provides the substrate 50 into the buffer chamber 20 (S330). The first blade 112 is in the first direction 1. The second blade 114 is in a direction between the first direction 1 and the second direction 2. The blades 110 are in an intersecting direction. The first blade 112 is provided in the buffer chamber 20. The blades 110 move in the first direction 1. The second blade 114 moves in the first direction without collision with side walls 34.

An operation where a substrate 50 is transported by the first blade 112 is described. The second blade 114 transports any other substrate 50 between buffer chambers 20 and process chambers 40. In contrast, the blades 110 may transport a substrate 50 from the buffer chambers 20 to the process chambers 40 or from the process chambers 40 to the buffer chambers 20, independently. For example, the first blade 112 transports the substrate 50 from the buffer chamber 20 to the process chamber 40, and the second blade 114 transports the substrate 50 from the process chamber 40 to the buffer chamber 20.

Figure 29:
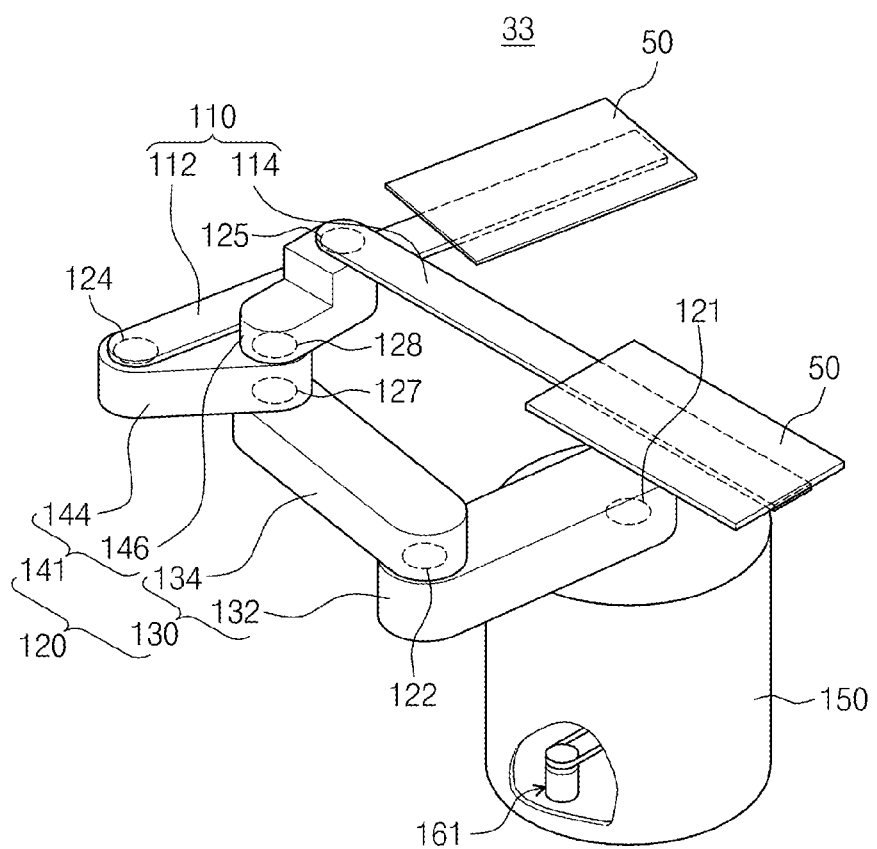
FIG. 29 illustrates a transfer unit of FIG. 3, according to another example embodiment of the inventive concepts.

FIG. 29 illustrates a transfer unit 33 of FIG. 3, according to some example embodiments of the inventive concepts.

Referring to FIG. 29, a transfer unit 33 may include a second arm 141 having a lower branch link 144 and an upper branch link 146. The lower and upper branch links 144 and 146 are connected with a first arm 130. Blades 110, the first arm 130 of an arm member 120, and a rotation body 150 may be substantially the same as those of FIG. 4.

The lower branch link 144 is on the first arm 130. The first arm 130 is connected with one side of the lower branch link 144. The lower branch link 144 has a first branch pivot 127. The lower branch link 144 rotates on the first arm 130. The first blade 112 is on the lower branch link 144. A first blade pivot 124 of the first blade 112 is connected with the other side of the lower branch link 144. The first blade 112 rotates on the lower branch link 144.

The upper branch link 146 rotates on the lower branch link 144. The first arm 130 is connected with one side of the upper branch link 146. The upper branch link 146 has a second branch pivot 128. The second branch pivot 128 is on the first branch pivot 127. The upper branch link 146 rotates on the lower branch link 144. The second blade 114 is on the upper branch link 146. The second blade 114 is connected with the other side of the upper branch link 146. The upper branch link 146 is shorter than the lower branch link 144. In contrast, the upper branch link 146 and the lower branch link 144 may have the same length. The upper branch link 146 rotates on the first blade 112.

A driving member 161 provides a driving force to the lower branch link 144 and the upper branch link 146. The lower branch link 144 and the upper branch link 146 rotate independently. The first blade 112 rotates on the lower branch link 144. A rotation angle of the first blade 112 may be smaller than about 360 degrees. The reason is that the first blade 112 is not overlapped with the upper branch link 146. The second blade 114 rotates on the upper branch link 146. The second blade 114 rotates about 360 degrees.

Figure 30:
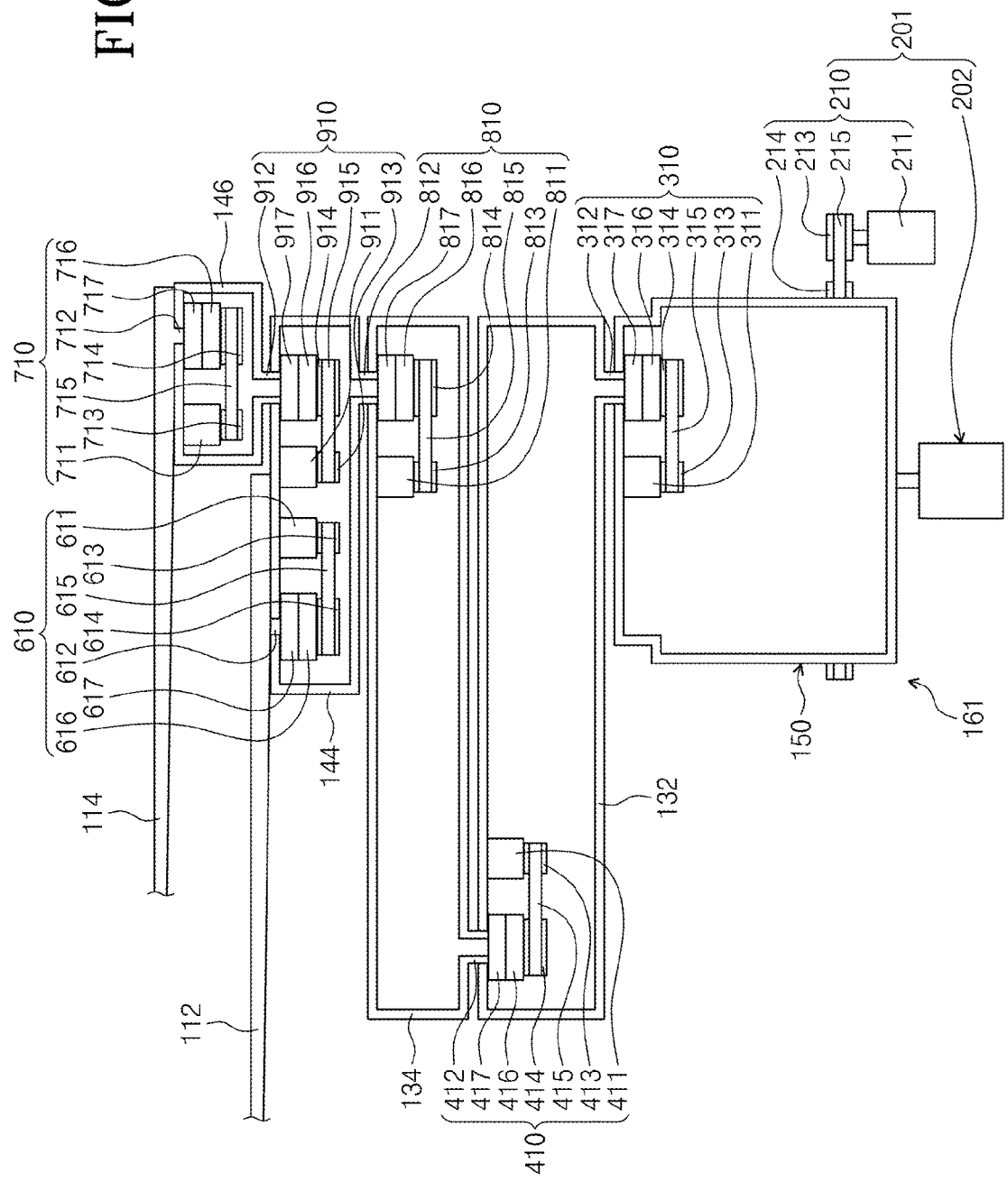
FIG. 30 illustrates a driving member of FIG. 29, according to an example embodiment of the inventive concepts.

FIG. 30 illustrates a driving member 161 of FIG. 29, according to some example embodiments of the inventive concepts.

Referring to FIG. 30, a driving member 161 may include a rotation body driver 201, a lower link driver 310, an upper link driver 410, first blade driver 610, branch link drivers 810 and 910, and a second blade driver 710. The rotation body driver 201, the lower link driver 310, and the upper link driver 410 may be substantially the same as those of FIG. 8.

The branch link drivers 810 and 910 may include a lower branch link driver 810 and an upper branch link driver 910. The lower branch link driver 810 is in an upper link 134. The lower branch link driver 810 may include a motor 811, a first pivot 812, a first pulley 813, a second pulley 814, a belt 815, a reducer 816, and a magnetic fluid seal 817. The motor 811 and the pivot 812 are spaced from each other. The first pivot 812 is mounted under one side of the lower branch link 144. The first pivot 812 is extended into the upper branch link 134. The first pulley 813 is connected with the motor 811. The first pulley 813 and the second pulley 814 are connected by the belt 815. The second pulley 814 is connected with the reducer 816 on the first pivot 812. The magnetic fluid seal 817 is mounted on the first pivot 812 between the reducer 816 and the lower branch link 144.

The upper branch link driver 910 is in the lower upper link 144. The upper branch link driver 910 may include a motor 911, a second pivot 912, a first pulley 913, a second pulley 914, a belt 915, a reducer 916, and a magnetic fluid seal 917. The motor 911 and the pivot 912 are spaced from each other. The second pivot 912 is mounted under one side of the upper branch link 146. The first pivot 912 is extended into the lower branch link 144. The first pulley 913 is connected with the motor 911. The first pulley 9813 and the second pulley 914 are connected by the belt 915. The second pulley 914 is connected with the reducer 916 on the second pivot 912. The magnetic fluid seal 917 is mounted on the second pivot 912 between the reducer 916 and the lower branch link 144. The first and second pivots 812 and 912 are aligned in the same direction. The first and second pivots 812 and 912 rotate independently.

A first blade driver 610 is in the lower branch link 144. A second blade driver 710 is in the upper branch link 146. The first and second blade drivers 610 and 710 may be substantially the same as those of FIG. 8.

Figure 31:
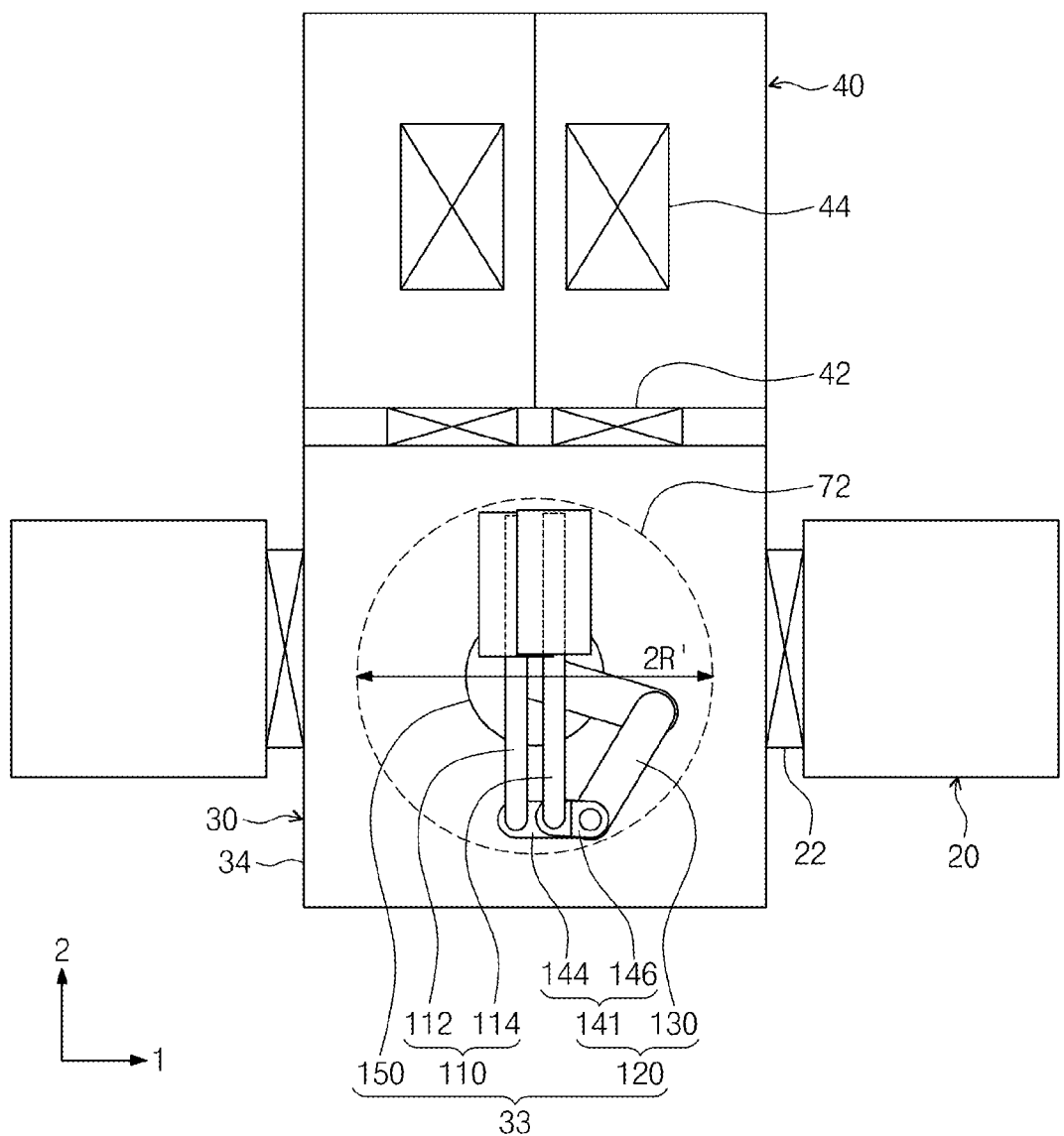
FIG. 31 illustrates a transfer unit in a transfer chamber 30 of FIG. 1.

FIG. 31 illustrates a transfer unit 33 in a transfer chamber 30 of FIG. 1.

Referring to FIG. 31, when in a parallel direction, blades 110 have a minimum and/or desired rotatory area 72. A diameter 2R' of the minimum and/or desired rotatory area 72 is greater than lengths of the blades 110. In some example embodiments, a length L2 of each side wall 34 of a transfer chamber 30 may be greater than the diameter 2R' of the minimum or reduced rotatory area 72. A second arm 141 reduces a distance between parallel blades 110. For example, a lower branch link 144 and an upper branch link 146 are overlapped. The lower branch link 144 rotates without interference of the first blade 112 and the upper branch link 146. In contrast, a length L2 of the transfer chamber 30 may be reduced until it is equal to the diameter 2R' of the minimum and/or desired rotatory area 72.

Figure 32:
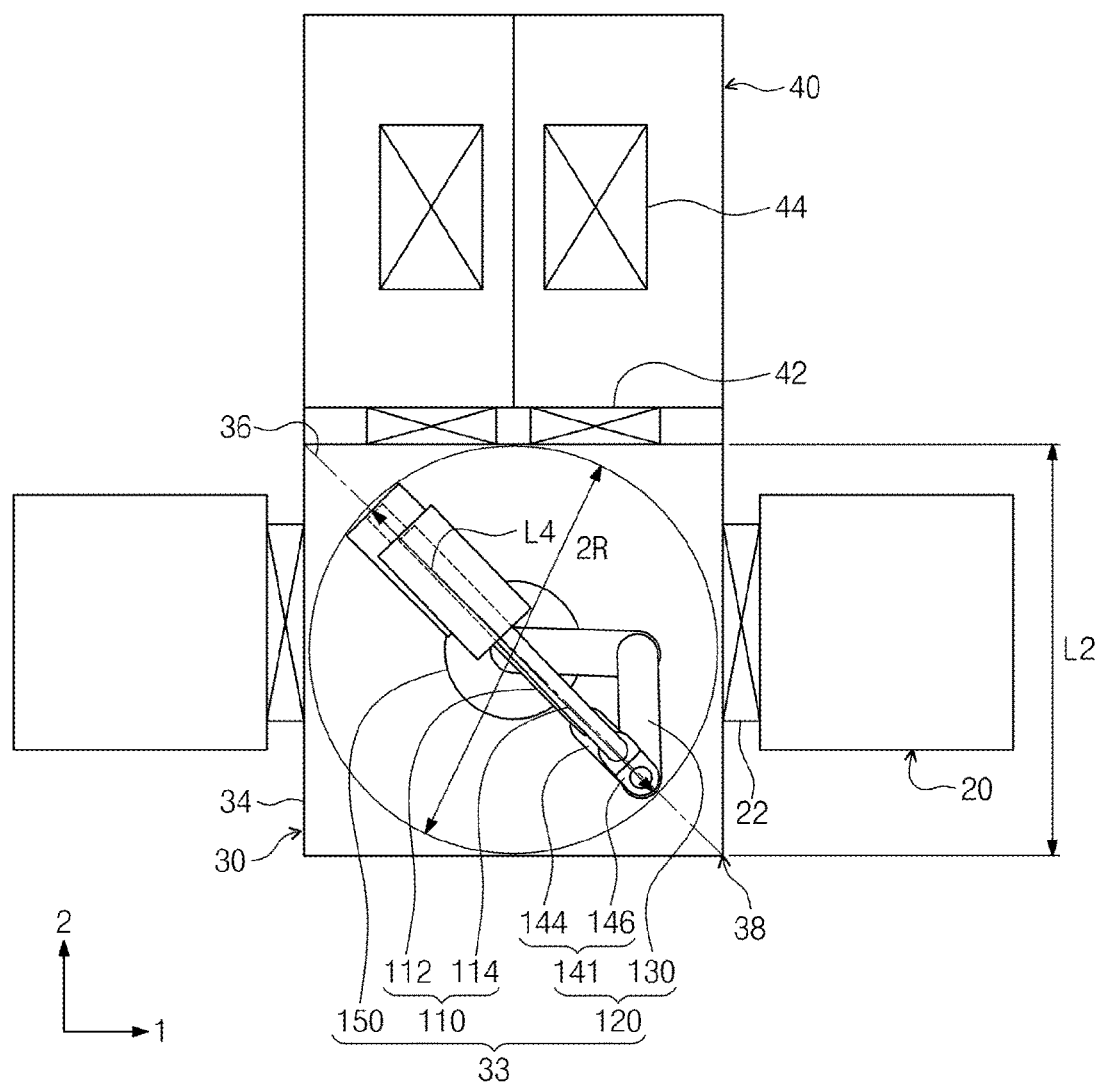
FIG. 32 illustrates a transfer chamber including side walls of which the lengths are reduced to correspond to a diameter of a minimum and/or desired rotatory area 72 of FIG. 31, according to an example embodiment of the inventive concepts.

FIG. 32 illustrates a transfer chamber 30 including side walls 34 of which the lengths are reduced to correspond to a diameter 2R' of a minimum and/or desired rotatory area 72 of FIG. 31, according to example embodiments of the inventive concepts.

Referring to FIG. 32, left and right positions of the blades 110 are switched at a corner 38 of a transfer chamber 30. The blades 110 and a second arm 141 are on the diagonal line 36. A lower branch link 144 and an upper branch link 146 are overlapped on the diagonal line 36. As the second arm 140 rotates, left and right positions of the first and second blades 112 and 114 are switched on the basis of the diagonal line 36. Accordingly, it is possible to switch left and right positions of the blades 110 on the diagonal line 36.

A straight line length L4 of the first blade 112 and the second arm 140 may be longer than a diameter 2R' of a minimum and/or desired rotatory area 72. Length L2 of the side walls 34 may be shorter than the straight line length L4.

Figure 33:
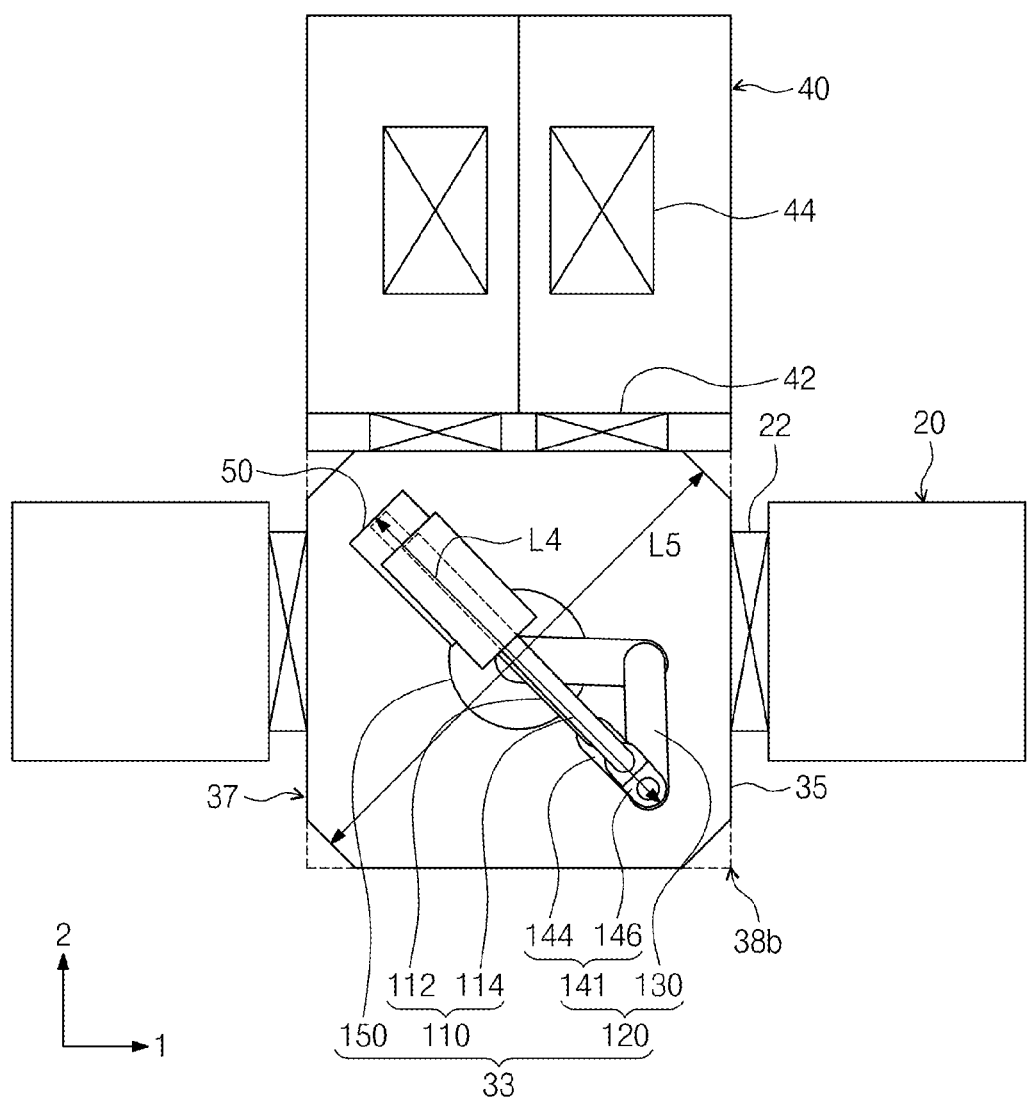
FIG. 33 illustrates a transfer chamber of FIG. 32, according to another example embodiment of the inventive concepts.
Figure 34:
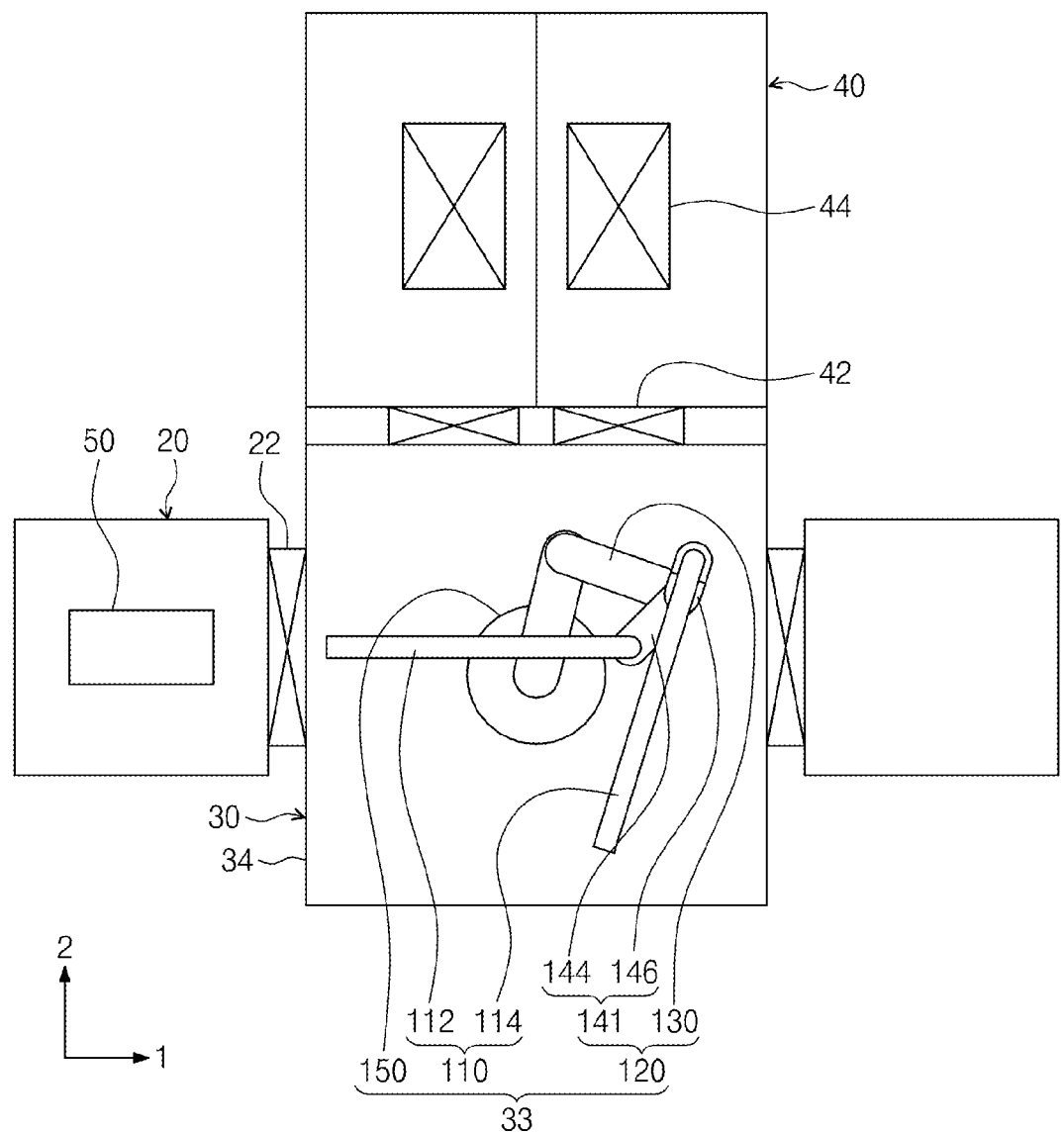
FIGS. 34 to 45 illustrate another example embodiment of an operation of a transfer unit according to a substrate treating method of FIG. 15.
Figure 35:
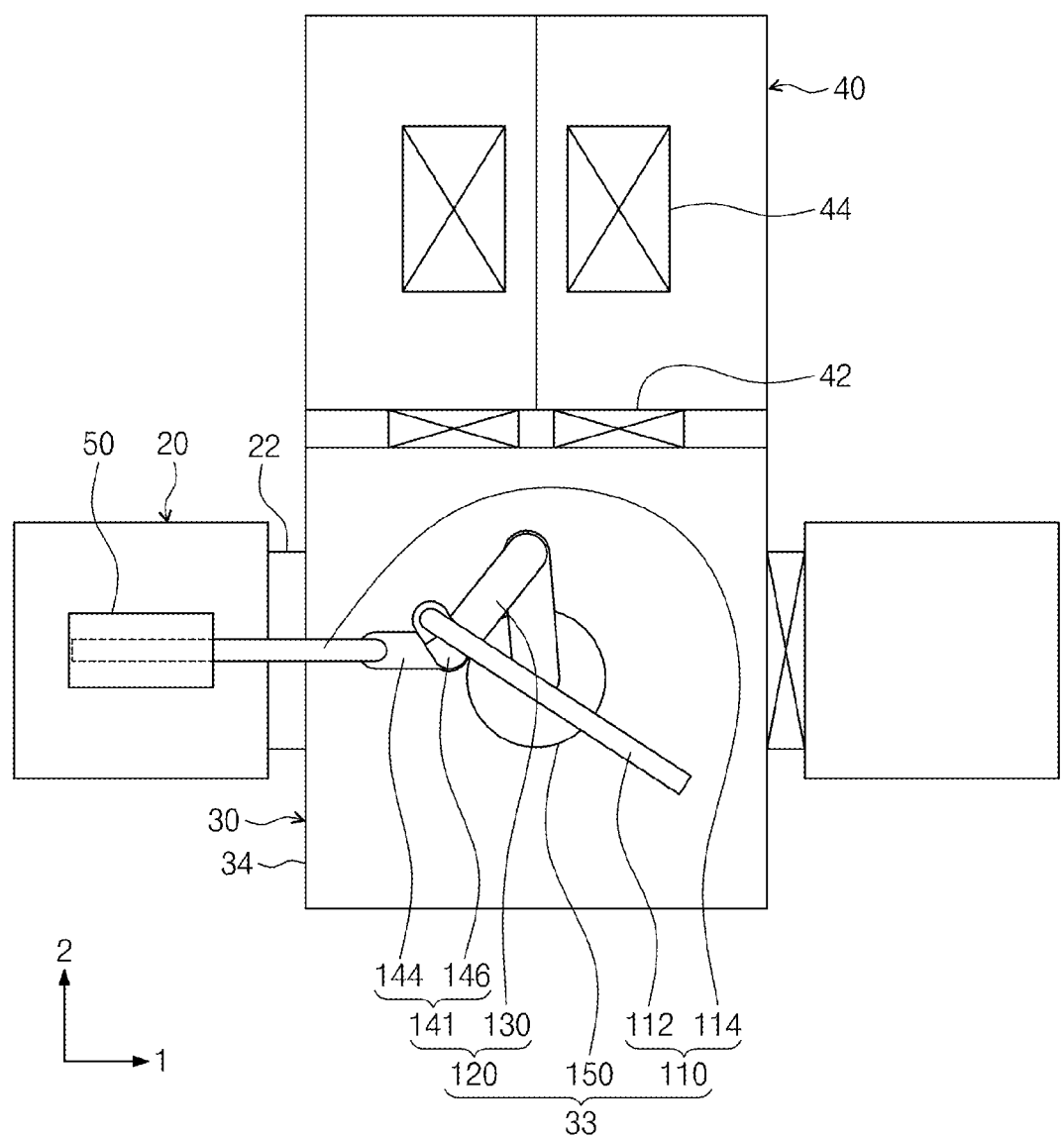
Figure 36:
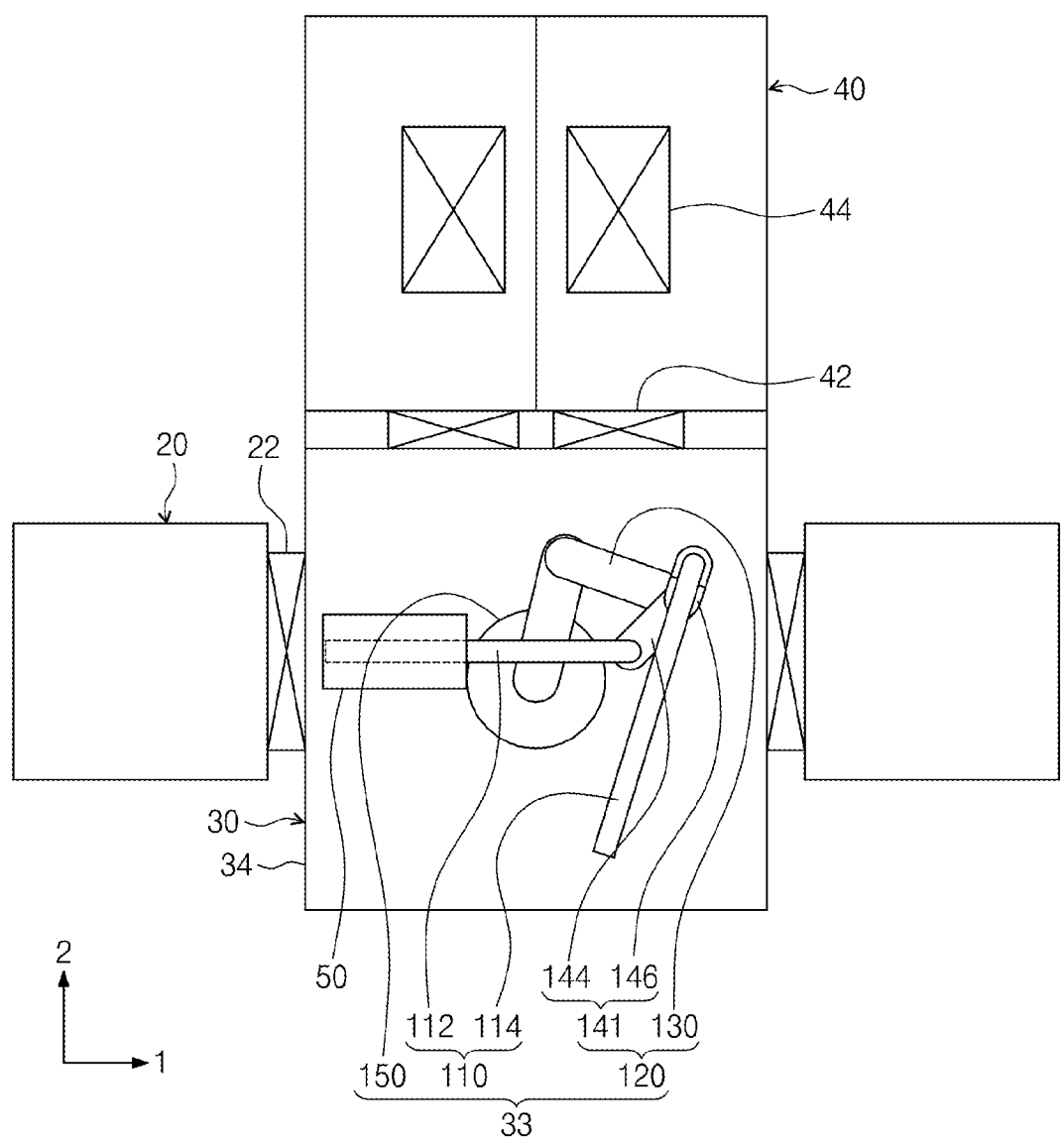

FIG. 33 illustrates a transfer chamber 37 of FIG. 32, according to some example embodiments of the inventive concepts.

Referring to FIG. 33, a transfer chamber 37 may include side walls 35 that constitute an octagonal shape formed by cutting the corners 38b of a square. A straight line length L4 of a first blade 112 and a lower branch link 144 may be shorter than a length L5 of a diagonal line 36. Even though the length L5 of the diagonal line 36 of the square becomes shorter than the straight line length L4, it is possible to switch positions of the blades 110. If the length L5 of the diagonal line 36 is over the straight line length L4, the corners 38b of the transfer chamber 30 may be cut. Accordingly, the transfer chamber 30 has a square shape of which the corners 38a are cut and which has the length L5 of the diagonal line 36 longer than the straight line L5.

FIGS. 34 to 45 illustrate example embodiments of an operation of a transfer unit 32 according to a substrate treating method of FIG. 15.

Referring to FIGS. 15 and 34 to 36, a transfer unit 32 transports a substrate 50 from a buffer chamber 20 into a transfer chamber 30 (S110). Blades 110 are in an intersecting direction as a second arm 141 rotates. In some example embodiments, the first blade 112 is in a first direction 1. The second blade 114 is in a direction between the first direction 1 and a second direction 2.

Figure 37:
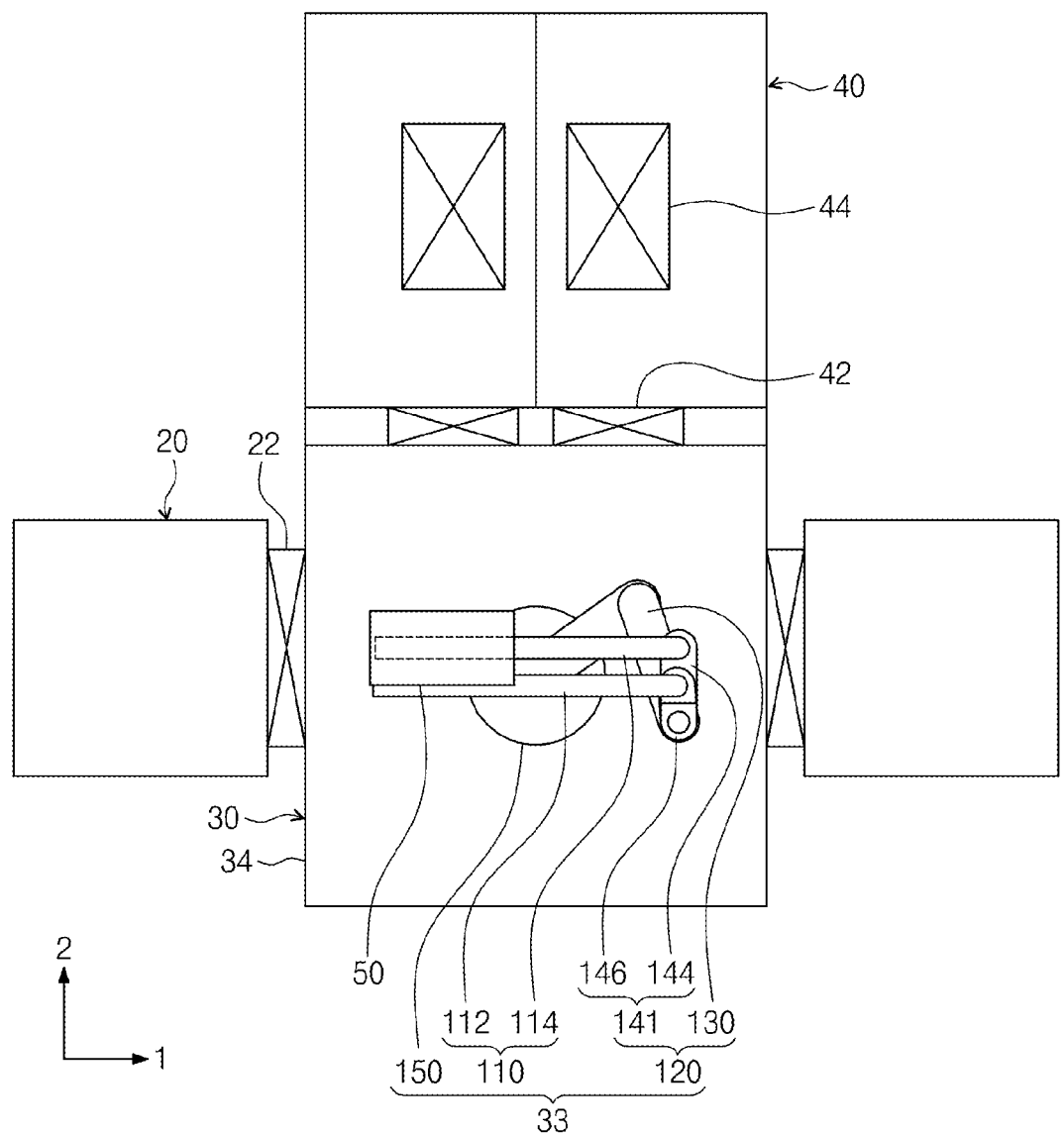
Figure 38:
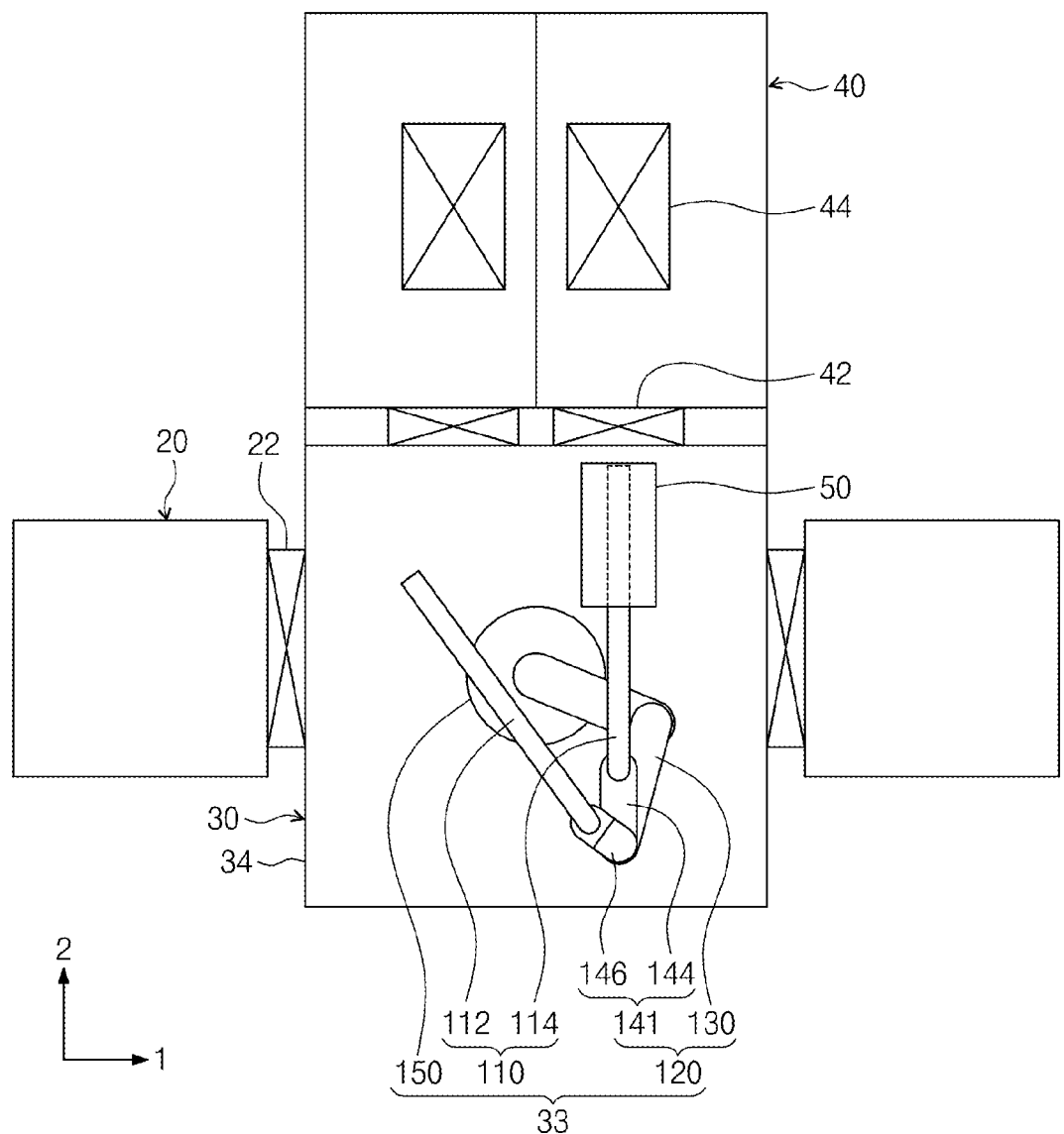

Referring to FIGS. 15, 37, and 38, the blades 110 are parallel with each other and rotate with a rotation body 150 as the center (S120). First, the blades 110 are parallel along the first direction 1. A lower branch link 144 and an upper branch link 146 are overlapped. Next, the blades 110 rotate from the first direction 1 to the second direction 2. The blades 110 rotate with the rotation body 150 as the center.

Figure 39:
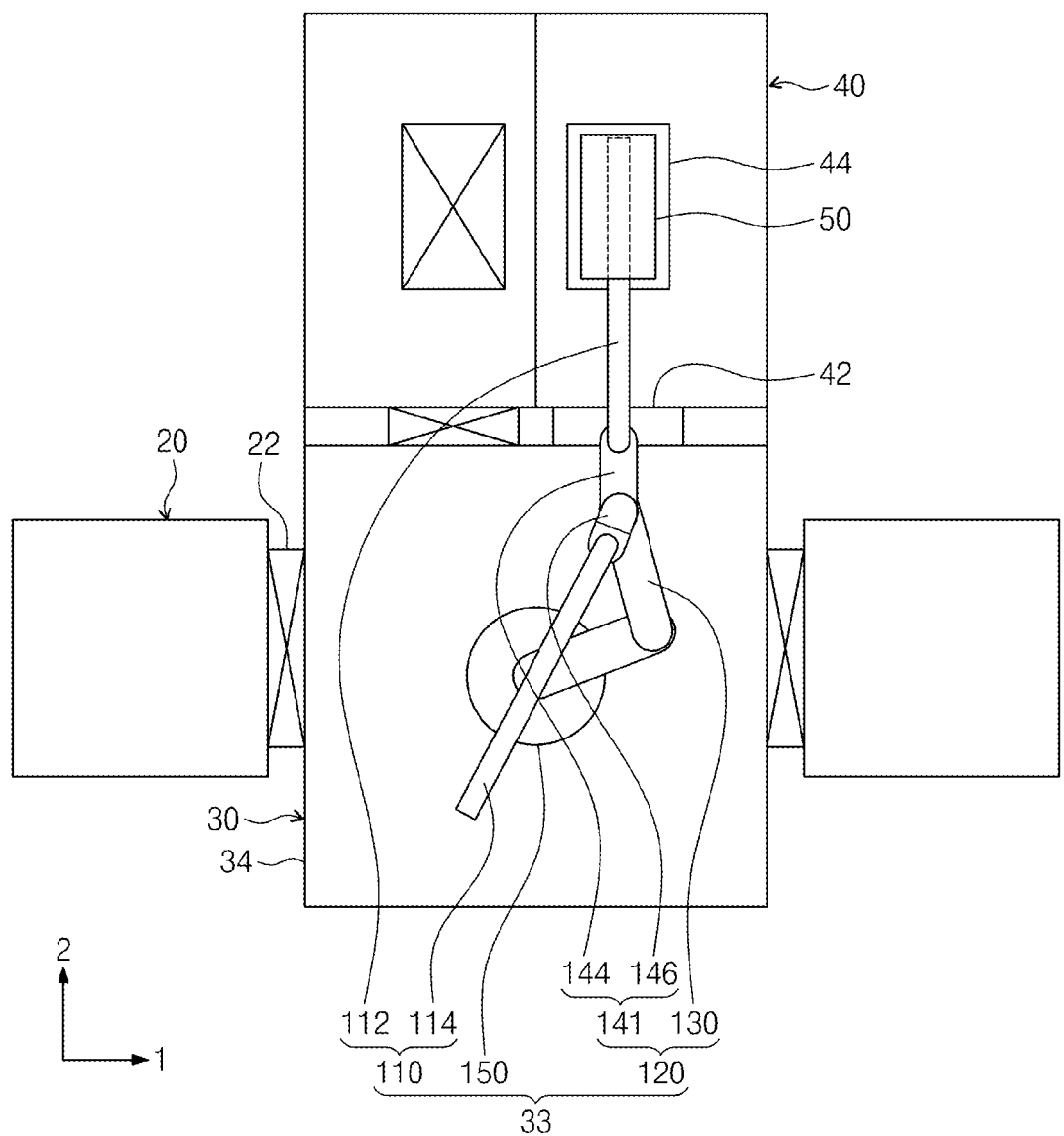
Figure 40:
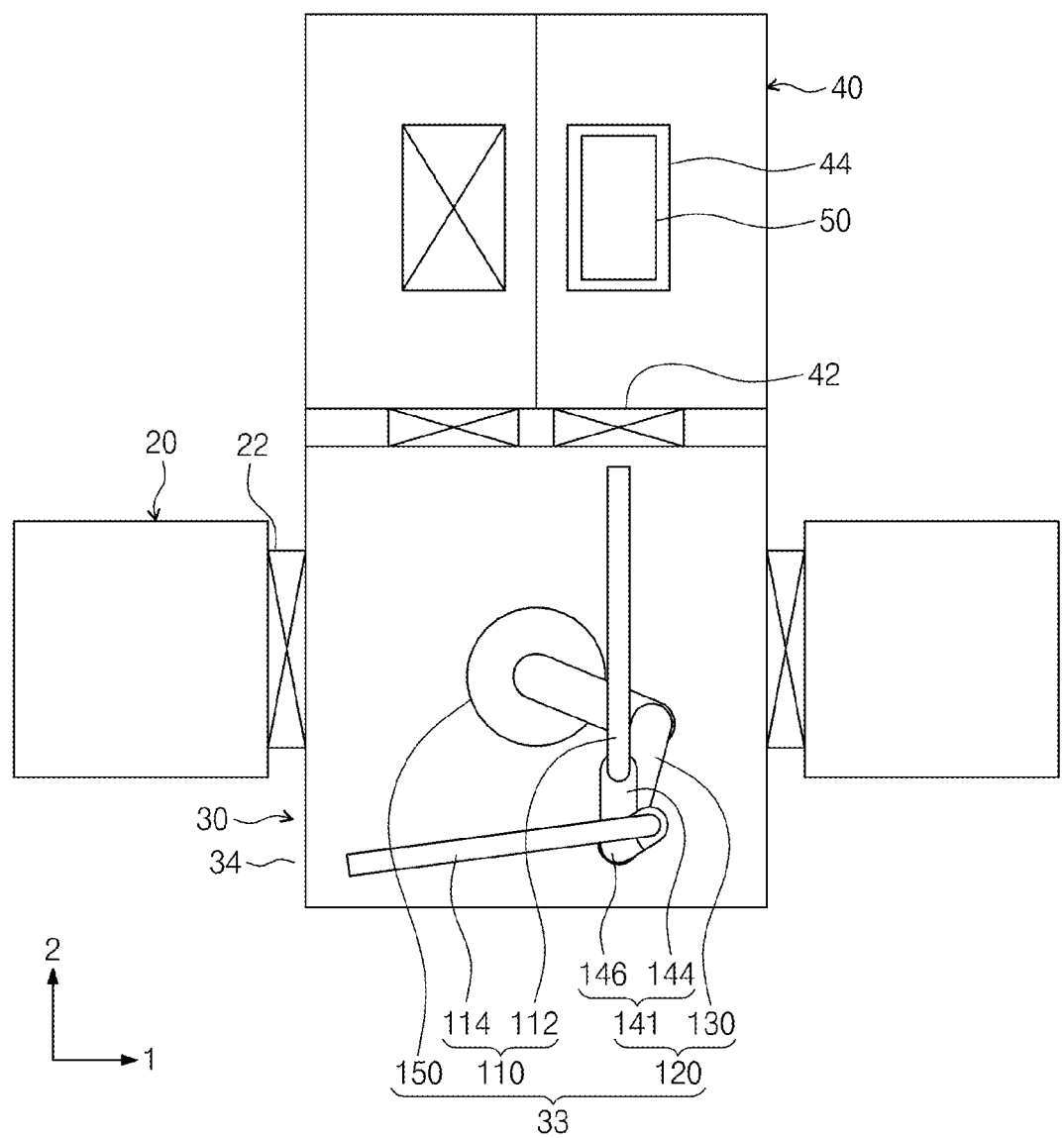

Referring to FIGS. 15, 39, and 40, the transfer unit 32 transports the substrate 50 from the transfer chamber 30 to the process chamber 40 (S130). The first blade 112 is in the second direction 2. The second blade 114 is between the first direction 1 and the second direction 2.

Next, when the first blade 112 returns to the transfer chamber 30, the process chamber 40 performs a manufacturing process about the substrate 50 (S200). When the manufacturing process about the substrate 50 is completed, the first blade 112 unloads the substrate 50 from the process chamber 40 to the buffer chamber 20 in a reverse order of the above-described loading operation.

Referring to FIGS. 15, 38, and 39, the first blade 112 transports the substrate 50 from the process chamber 40 to the transfer chamber 30 (S310). The blades 110 are in an intersecting direction.

Figure 41:
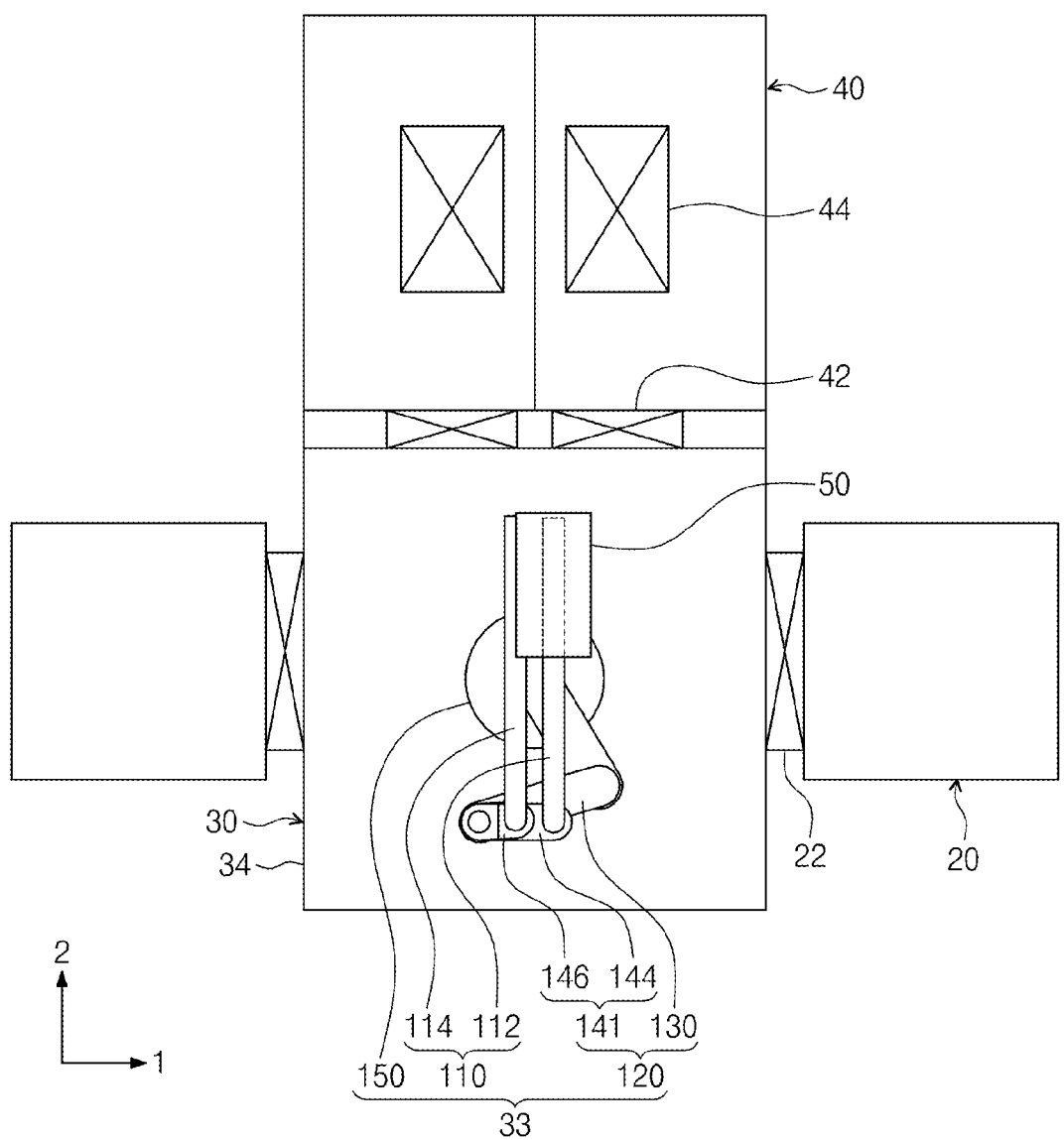
Figure 42:
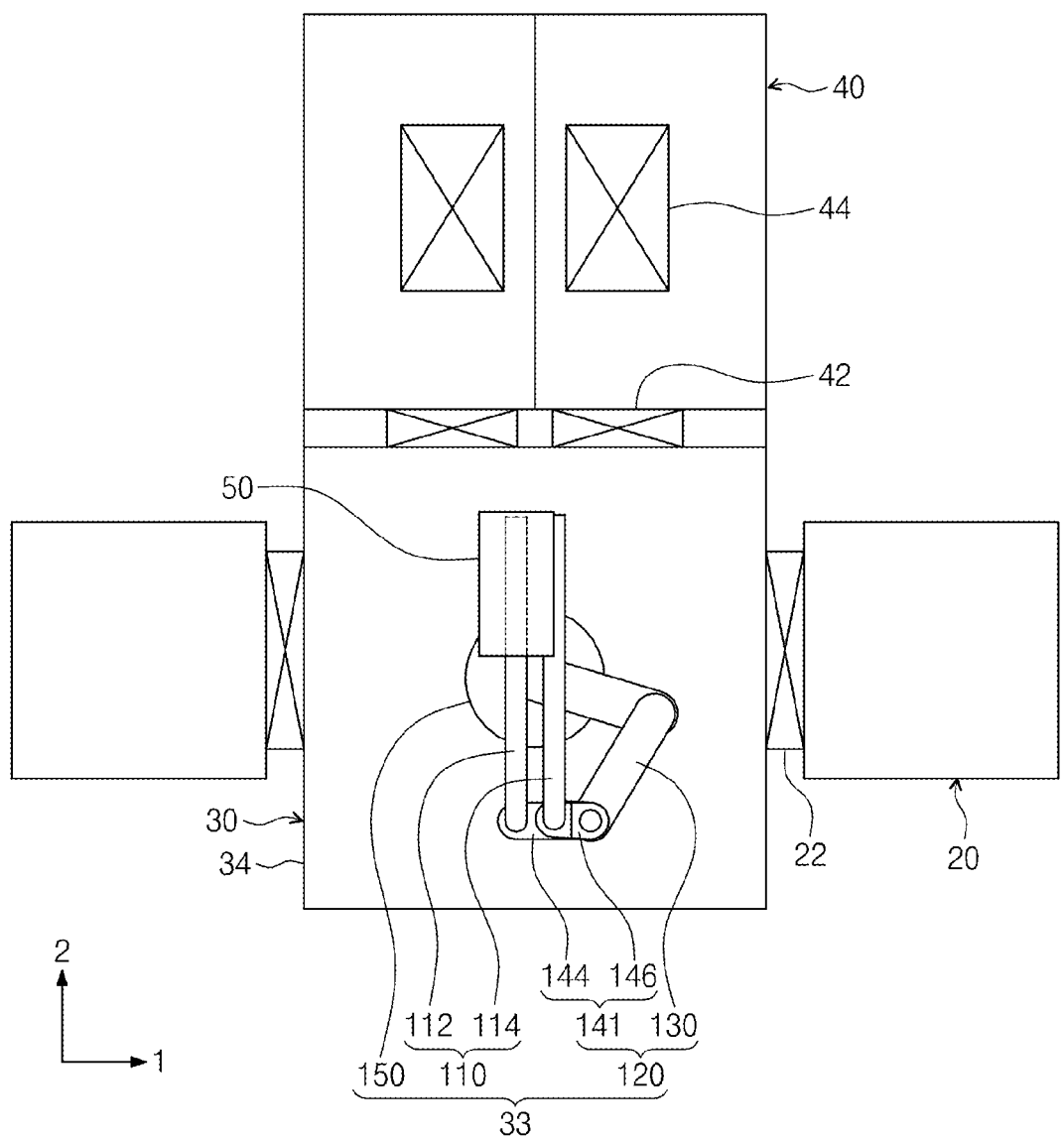

Referring to FIGS. 41 and 42, left and right positions of the blades 110 are switched. As the second arm 140 rotates, positions of the blades 110 are switched. The blades 110 are parallel along the second direction 2. Positions of the blades 110 may be changed according to a connection position of the buffer chambers 20 and the process chambers 40 with respect to the transfer chamber 30. For example, the process chambers 40 and the buffer chamber 20 may be adjacent to a corner 38 of the transfer chamber 30. In the event that the substrate 50 is transported between the buffer chambers 20, left and right positions of the blades 110 may be switched. A lower branch link 144 and an upper branch link 146 changes left and right positions of the first and second blades 112 and 114.

Figure 43:
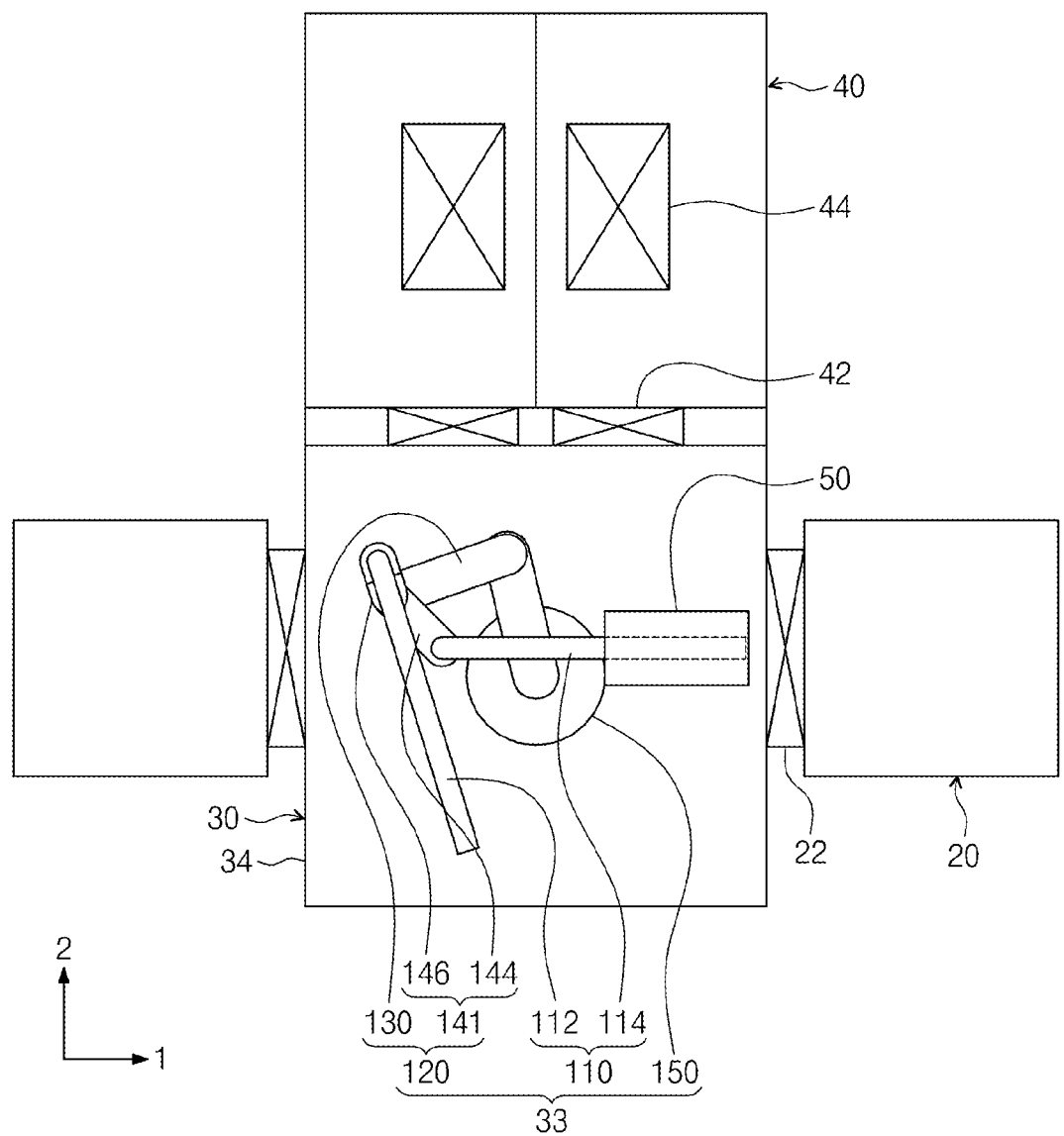

Referring to FIGS. 15 and 43, the blades 110 rotate in the first direction (S320). The blades 110 are positioned in the first direction 1. Next, the second blade 114 rotates in a direction between the first direction 1 and the second direction 2. The blades 110 are rotated from a parallel direction to an intersecting direction.

Figure 44:
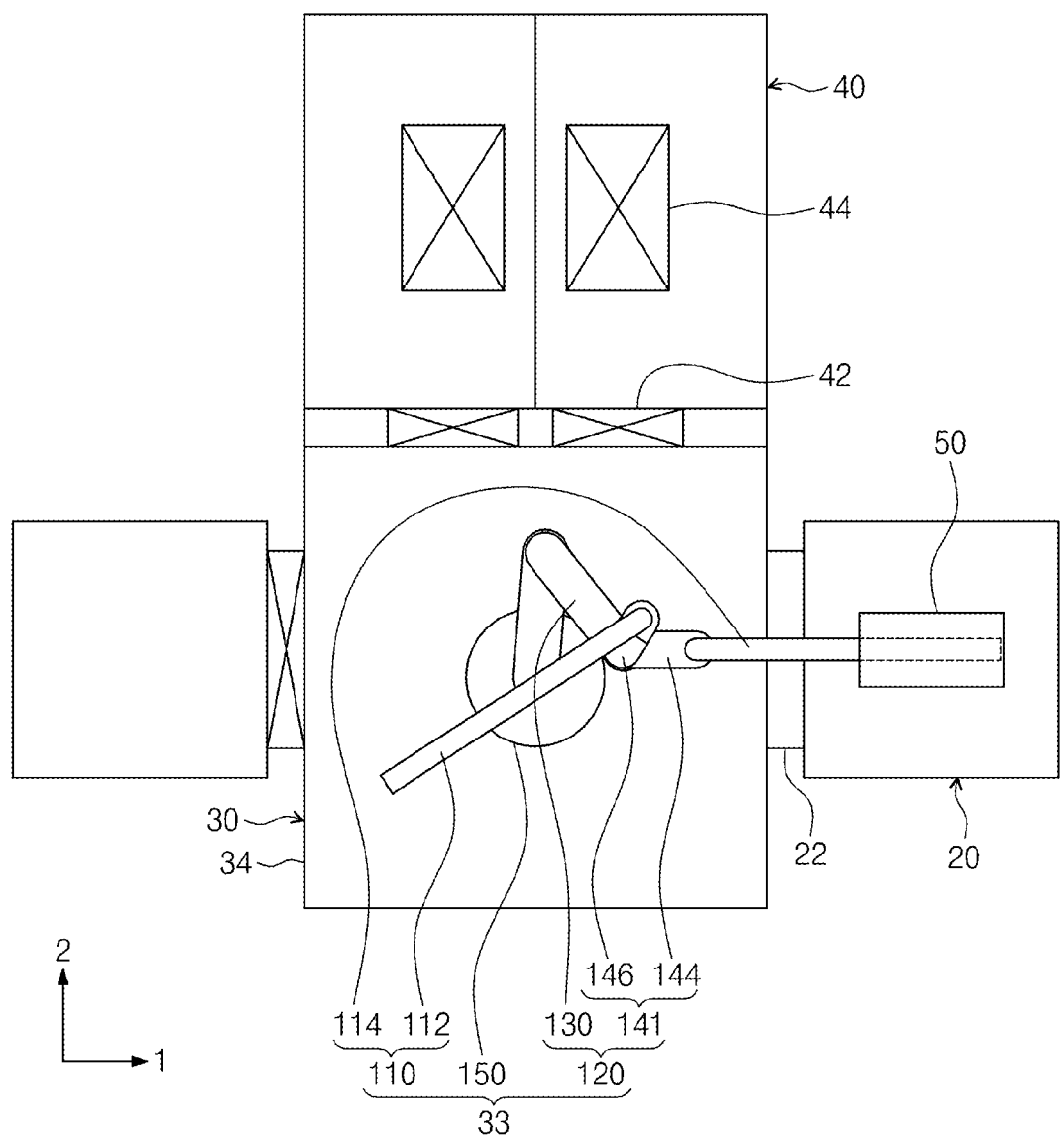
Figure 45:
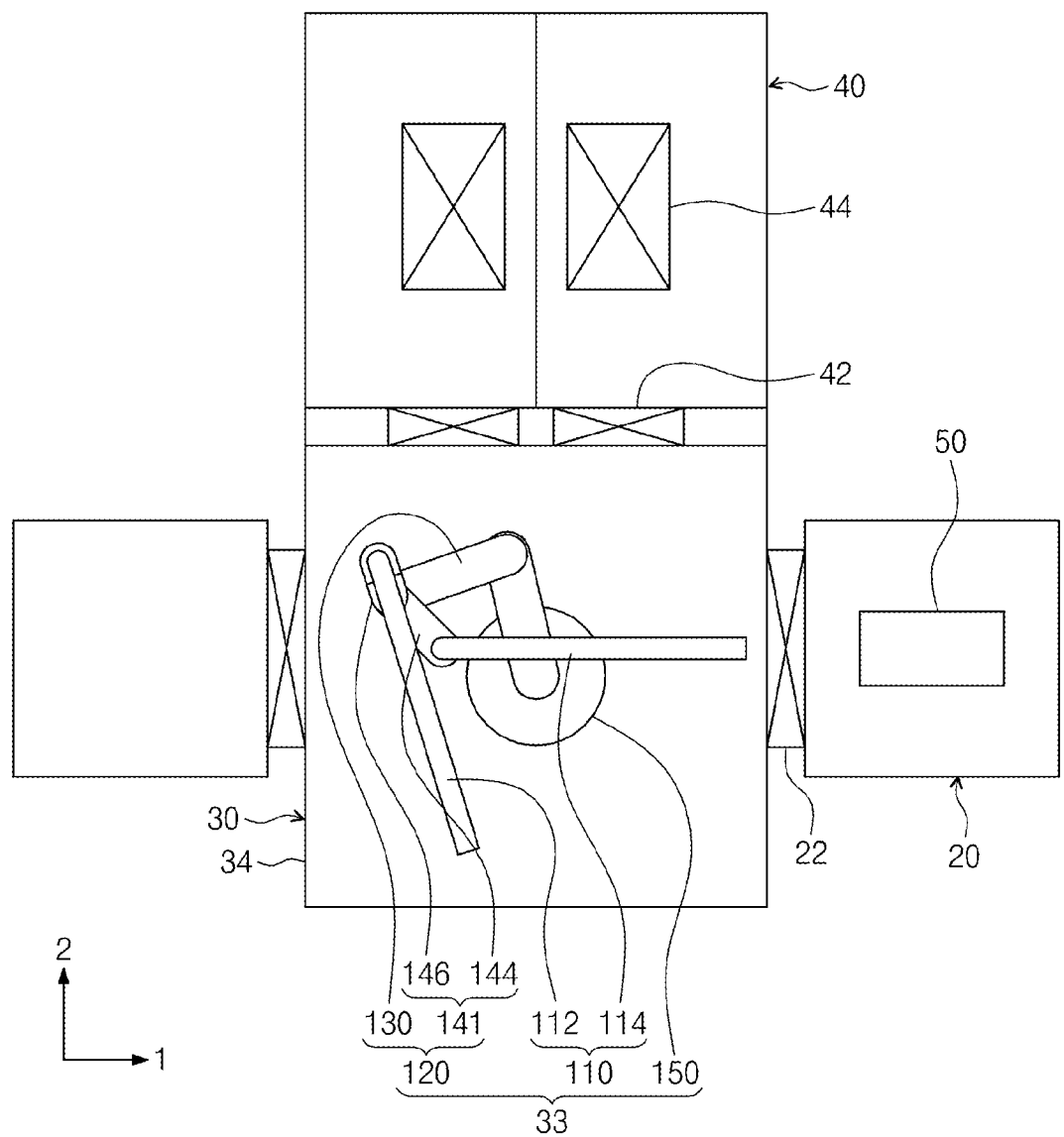

Referring to FIGS. 15, 44, and 45, the first blade 112 provides the substrate 50 into the buffer chamber 20 (S330). The first blade 112 is positioned in the first direction 1. The second blade 114 is positioned in a direction between the first direction 1 and the second direction 2. The blades 110 are disposed in an intersecting direction. The first blade 112 is provided in the buffer chamber 20. The blades 110 move in the first direction 1. The second blade 114 moves in the first direction without collision with side walls 34.

As described above, a substrate transfer unit according to some example embodiments of the inventive concepts may include a first arm, a second arm placed on the first arm, and a plurality of blades placed on the second arm. When the blades rotate, the second arm aligns the blades in a parallel direction, thereby minimizing or reducing a rotatory area. A transfer chamber has a square shape having one edge corresponding to a diameter of a minimum and/or desired rotatory area of the second arm and the blades, thereby making it possible for the blades to rotate in the transfer chamber without movement interference.

While the inventive concepts have been described with reference to example embodiments, it will be apparent to those skilled in the art that various changes and modifications may be made without departing from the spirit and scope of the inventive concept. Therefore, it should be understood that the above example embodiments are not limiting, but illustrative.

What is claimed is:

1. A substrate transfer unit comprising:
   a rotation body;
   an arm member on the rotation body, the arm member comprising a first arm and a second arm, the first arm including a lower link on the rotation body and an upper link connected on one side of the lower link and the second arm including a first portion and a second portion; and
   first and second blades on the arm member,
   the first portion having a first pivot on the other side of the upper link and being connected with the first blade at a first height from the first pivot,
   the second portion being connected with the first portion and with the second blade at a second height, higher than the first height, from the first pivot, and
   the second arm arranging the first and second blades in a T-shape to minimize loading occupation area of substrates on the first and second blades when the first arm stretches or shrinks by a folding and spread of the lower link and the upper link.

2. The substrate transfer unit of claim 1, wherein the first blade comprises a first blade pivot connected with the first portion and the second blade comprises a second blade pivot connected with the second portion, and
   wherein the first pivot is between the first and second blade pivots.

3. The substrate transfer unit of claim 1, wherein a thickness of the first blade is smaller than a difference between the first height and the second height.

4. The substrate transfer unit of claim 1, wherein the first portion comprises a lower branch link and the second portion comprises an upper branch link having a second pivot on the lower branch link.

5. The substrate transfer unit of claim 4, wherein the second pivot is aligned with the first pivot.

6. The substrate transfer unit of claim 4, wherein a length of the upper branch link is shorter than a length of the lower branch link.

7. The substrate transfer unit of claim 1, wherein a length of each of the first and second blades is longer than a length of the first arm.

8. The substrate transfer unit of claim 1, wherein a length of the second arm is shorter than a length of each of the lower link and the upper link.

9. The substrate transfer unit of claim 1, further comprising:
- a driving member configured to provide a driving force to the rotation body, the arm member, and the first and second blades,
- wherein the driving member comprises,
- an arm driver configured to rotate the arm member,
- first and second blade drivers configured to rotate the first and second blades independently of the arm driver, and
- a vertical movement apparatus configured to move the arm member and the first and second blades upwards or downwards, and
- wherein the first and second blade drivers are independently in the second arm.

* * * * *